United States Patent
Li

(10) Patent No.: US 10,128,841 B2
(45) Date of Patent: Nov. 13, 2018

(54) TERMINATION CIRCUIT, RECEIVER AND ASSOCIATED TERMINATING METHOD CAPABLE OF SUPPRESSING CROSSTALK

(71) Applicant: MEDIATEK INC., Hsin-Chu (TW)

(72) Inventor: An-Siou Li, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/685,028

(22) Filed: Aug. 24, 2017

(65) Prior Publication Data
US 2018/0083623 A1   Mar. 22, 2018

Related U.S. Application Data

(60) Provisional application No. 62/398,563, filed on Sep. 23, 2016, provisional application No. 62/396,267, filed on Sep. 19, 2016.

(51) Int. Cl.
*H03K 19/00* (2006.01)
*H04B 1/16* (2006.01)

(52) U.S. Cl.
CPC .......... *H03K 19/0005* (2013.01); *H04B 1/16* (2013.01)

(58) Field of Classification Search
None
See application file for complete search history.

(56) References Cited

U.S. PATENT DOCUMENTS

| 6,356,106 B1* | 3/2002 | Greeff | G06F 13/4086 326/30 |
| 9,286,958 B2* | 3/2016 | Komyo | H03K 19/0005 |
| 2012/0092057 A1 | 4/2012 | Yu | |

OTHER PUBLICATIONS

Bae, et al.: "A 40nm 2Gb 7Gb/s/pin GDDR5 SDRAM with a Programmable DQ Ordering Crosstalk Equalizer and Adjustable Clock-Tracking BW"; ISSCC 2011 / Session 28 / DRAM & High-Speed I/O / 28.6; pp. 1-3.
TIPO Office Action dated Apr. 19, 2018 in Taiwan application (No. 106131697).

* cited by examiner

*Primary Examiner* — Jany Richardson
(74) *Attorney, Agent, or Firm* — McClure, Qualey & Rodack, LLP

(57) ABSTRACT

A termination circuit, a receiver and associated terminating method are provided. The termination circuit is applied to a receiving terminal for receiving a channel transmission signal. Being coupled to a control module, the termination circuit includes an upper circuit and a lower circuit. The upper circuit selectively conducts the receiving terminal to a first voltage terminal, and the lower circuit selectively conducts the receiving terminal to a second voltage terminal. The control module detects a voltage level of the receiving terminal in response to a trigger signal, and accordingly controls the first switching signal and the second switching signal for a termination duration. The termination duration is corresponding to an n-th data bit carried by the channel transmission signal.

20 Claims, 17 Drawing Sheets

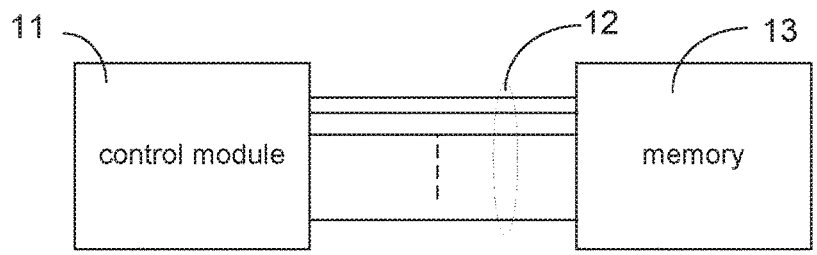
FIG. 1 (PRIOR ART)
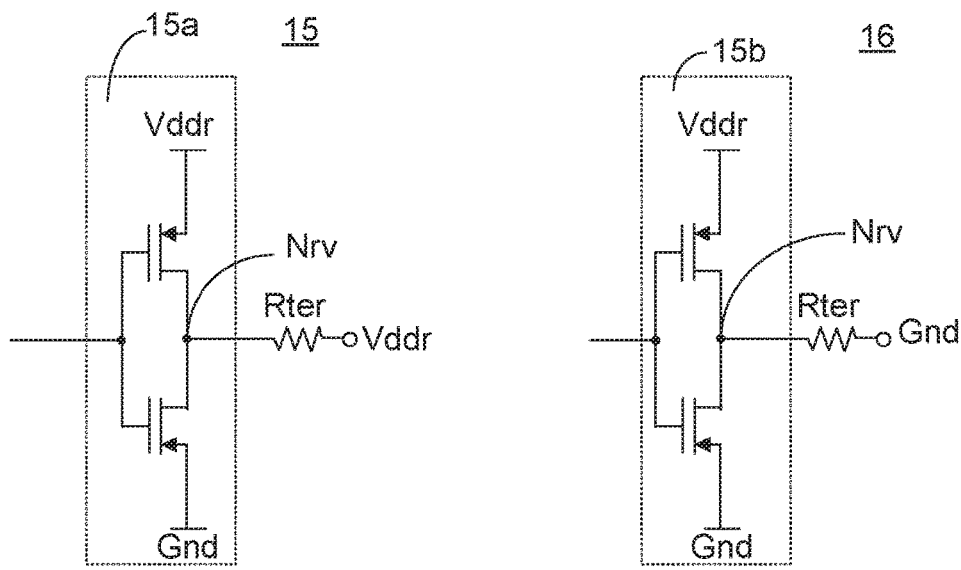
FIG. 2A
(PRIOR ART)
FIG. 2B
(PRIOR ART)

TERMINATION CIRCUIT, RECEIVER AND ASSOCIATED TERMINATING METHOD CAPABLE OF SUPPRESSING CROSSTALK

This application claims the benefit of U.S. provisional application Ser. No. 62/396,267, filed Sep. 19, 2016 and U.S. provisional application Ser. No. 62/398,563, filed Sep. 23, 2016, the disclosures of which are incorporated by reference herein in its entirety.

TECHNICAL FIELD

The disclosure relates in general to a termination circuit, a receiver and associated terminating method, and more particularly to a termination circuit, a receiver and associated terminating method capable of suppressing crosstalk between adjacent channels.

BACKGROUND

In recent years, mobile applications, such as portable electronic devices, multimedia products, wireless communications and so forth demand high-speed and high-throughput computations. Thus, memory speed goes up higher and channel counts between a control module and a memory continue to increase. However, faster data rate and switching speed imply that higher coupled noise may be caused among adjacent signal channels (transmission lines).

FIG. 1 is a schematic diagram illustrating a parallel bus configuration between a control module and a memory circuit. As shown in FIG. 1, a memory bus 12 between the control module 11 and the memory 13 includes many signal channels which are very close to each other.

Crosstalk is the effect on a signal caused by the high-speed switching of a nearby signal, and crosstalk can be a major contributor to the amount of jitter. Once a large amount of jitter exists in the signal channel, bit errors in the channel transmission signal may cause. Alternatively speaking, crosstalk between adjacent signal channels may cause distortion and suppression of crosstalk is important, and crosstalk can be a major contributor of the jitter. With the high density of signal channels included in the memory bus 12, crosstalk issue between adjacent signal channels becomes serious.

FIGS. 2A and 2B are schematic diagrams illustrating termination resistors are used to suppress crosstalk. In these figures, each of the receivers 15, 16 includes a buffer circuit 15a, 16a and a termination resistor Rter. The buffer circuits 15a, 16a convert a channel transmission signal received from the signal channels to an inverted channel transmission signal (buffered channel transmission signal) at a receiving terminal Nrv, and the termination resistors Rter are often utilized to suppress crosstalk between adjacent channels.

In FIG. 2A, the termination resistor Rter conducts a receiving terminal Nrv to a source voltage Vddr and a dc current always flows through the buffer circuit 15a if an input of the buffer circuit 15a is at a high voltage level (for example, the source voltage level Vddr). In FIG. 2B, the termination resistor Rter conducts the receiving terminal Nrv to a ground voltage Gnd, and a dc current always flows through the buffer circuit 16a if an input of the buffer circuit 16a is at a low voltage level (for example, the ground voltage level Gnd).

Accompanied with the dc currents, the output signals of the receivers 15, 16 are biased, and swing ranges of the output signals are affected. Furthermore, the dc currents flowing through the buffer circuits 15a, 16a and the termination resistors Rter may cause extra power consumption.

SUMMARY

The disclosure is directed to a termination circuit, a receiver and associated terminating method capable of suppressing crosstalk. The termination circuit, the receiver and associated terminating method dynamically conduct a receiving terminal to one of a high voltage level and a low voltage level. In consequence, a swing range of a channel transmission signal can be maintained while the crosstalk between adjacent channels can be suppressed.

According to one embodiment, a termination circuit coupled to a control module and a receiving terminal for receiving a channel transmission signal is provided. The termination circuit includes an upper circuit and a lower circuit. The upper circuit includes a first termination component and a first switch. The first termination component is coupled to a first voltage terminal, and the first switch is coupled to the first termination component and the receiving terminal. The first switch selectively conducts the receiving terminal to the first termination component according to a first switching signal. The lower circuit includes a second termination component and a second switch. The second termination component is coupled to a second voltage terminal, and the second switch is coupled to the second termination component and the receiving terminal. The second switch selectively conducts the receiving terminal to the second termination component according to a second switching signal. The control module detects a voltage level of the receiving terminal in response to a trigger signal, and accordingly controls the first switching signal and the second switching signal for a termination duration. The termination duration is corresponding to an n-th data bit carried by the channel transmission signal.

According to another embodiment, a receiver for receiving at least one channel transmission signal through at least one receiving terminal is provided. The receiver includes at least one termination circuit and a control module. The at least one termination circuit is coupled to at least one signal channel through the at least one receiving terminal, wherein a first termination circuit of the at least one termination circuit is coupled to a first receiving terminal of the at least one receiving terminal. The first termination circuit includes an upper circuit and a lower circuit. The upper circuit includes a first termination component and a first switch. The first termination component is coupled to a first voltage terminal. The first switch is coupled to the first termination component and the first receiving terminal. The first switch selectively conducts the first receiving terminal to the first termination component according to a first switching signal. The lower circuit includes a second termination component and a second switch. The second termination component is coupled to a second voltage terminal. The second switch is coupled to the second termination component and the first receiving terminal. The second switch selectively conducts the first receiving terminal to the second termination component according to a second switching signal. The control module is coupled to the at least one termination circuit. The control module detects a voltage level of the first receiving terminal in response to a trigger signal, and accordingly controls the first switching signal and the second switching signal for a termination duration. The termination duration is corresponding to an n-th data bit carried by the channel transmission signal.

According to an alternative embodiment, a terminating method applied to a receiver including a control module and a termination circuit is provided. The termination circuit is coupled to a receiving terminal and the control module. The terminating method includes following steps. Firstly, a voltage level of the receiving terminal is detected by the control module in response to a trigger signal. Then, a first switching signal and a second switching signal are controlled by the control module for a termination duration. The termination duration is corresponding to an n-th data bit carried by the channel transmission signal. Finally, the termination circuit selectively conducts the receiving terminal to one of a first voltage terminal and a second voltage terminal according to the first switching signal and the second switching signal.

BRIEF DESCRIPTION OF THE DRAWINGS

FIG. 1 (prior art) is a schematic diagram illustrating a parallel bus configuration between a control module and a memory circuit.

FIGS. 2A and 2B (prior art) are schematic diagrams illustrating termination resistors are used to suppress crosstalk.

Figure 3A:
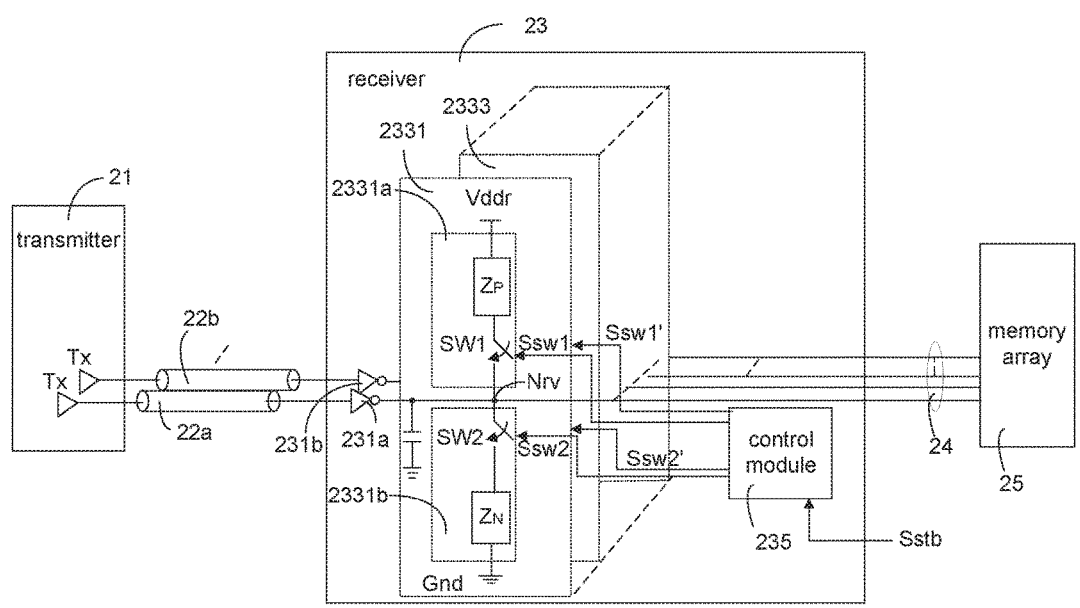
FIG. 3A is a schematic block diagram illustrating a receiver for receiving channel transmission signals through signal channels between a transmitter and a receiver.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

To suppress crosstalk, especially the crosstalk caused by reflection, a termination circuit, a receiver and associated terminating method are provided. The termination circuit, the receiver and the terminating method are capable of dynamically terminating a receiving terminal Nrv to a high voltage level or a low voltage level in response to patterns of data bits being carried by the channel transmission signal. By adopting the dynamically control mechanism, the effects of the dc current is reduced, and the swing range of the channel transmission signal can be increased. Simulation results also demonstrate the crosstalk between adjacent channels can be suppressed based on the termination circuit, the receiver and the terminated method according to the embodiments of the present disclosure.

FIG. 3A is a schematic block diagram illustrating a receiver for receiving channel transmission signals through signal channels between a transmitter 21 and a receiver 23. The transmitter 21 transmits signals to the receiver 23 through signal channels 22a, 22b, 22c. In this context, the signals received by the receiver 23 are defined as channel transmission signals. Data are serialized per signal channel at the transmitter 21 side.

The receiver 23 is coupled to a memory array 25 through an internal bus 24. The receiver 23 includes a control module 235, buffer circuits 231a, 231b and termination circuits 2331, 2333. The control module 235 is coupled to the termination circuits 2331, 2333, and the termination circuits 2331, 2333 are respectively coupled to the buffer circuits 231a, 231b.

Each of the termination circuits 2331, 2333 in the receiver 23 has similar layout, and the termination circuit 2331 is illustrated as an example. The termination circuit 2331 includes an upper circuit 2331a and a lower circuit 2331b. The upper circuit 2331a further includes a first switch SW1 and a first termination component $Z_P$, and the lower circuit 2331b further includes a second switch SW2 and a second termination component $Z_N$.

The first termination component $Z_P$ is coupled to the first voltage terminal having a first voltage level V1 and the second termination component $Z_N$ is coupled to a second voltage terminal having a second voltage level V2. The first voltage level V1 is greater than the second voltage level V2. The first voltage level V1 can be, for example, the source voltage Vddr, and the second voltage level V2 can be, for example, the ground voltage Gnd.

The control module 235 receives a trigger signal and generates many sets of switching signals to the termination circuits 2331, 2333. The 2 trigger signal can be but not limited to a strobe signal Sstb or a clock signal.

In the context, the trigger signal is assumed to be the strobe signal Sstb.

Each set of the switching signals is corresponding to one of the termination circuits 2331, 2333. For example, the control module 235 generates a first switching signal Ssw1 and a second switching signal Ssw2 to the termination circuit 231. Similarly, the control module 235 generates another set of the switching signals to the termination circuit 2333. The significant transitions of the strobe signal Sstb, including rising edges and falling edges, initiate termination durations Tterm in which the first switching signals Ssw1, Ssw1' and the second switching signals Ssw2, Ssw2' are generated and controlled.

If a data-transition occurs in a signal channel, timing deviation of the transition-edge is observed in the adjacent signal channel. Since the propagation velocity of the signal depends on the data bit pattern, the delay of data influence the data transition and crosstalk occurs.

Figure 3B:
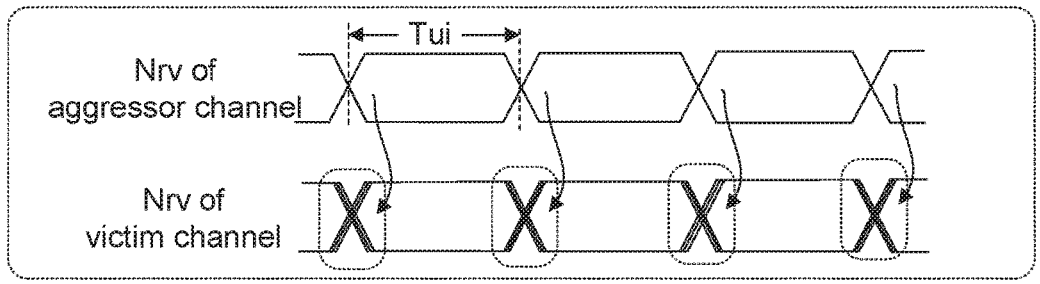
FIG. 3B is a schematic diagram illustrating skews of a victim channel.

FIG. 3B is a schematic diagram illustrating skews of a victim channel. A unit interval (hereinafter, UI) is the minimum time interval for the channel transmission signal. For example, for a communication system having 10 Gbps data rate, the UI is equivalent to 100 ps.

Channels originated from the same transmitter and received at the same receiver can be considered as combination of a victim channel and a plurality of aggressor channels.

The combination of the signals applied to adjacent signal channels can be classified into two categories, an even mode and an odd mode. The even mode refers to the condition when the data bits carried by the victim channel and the aggressor channels are switching in the same direction. The odd mode refers to the condition when the data bits carried by the aggressor channels are switching in the opposite direction to the data bits carried by the victim channel.

Velocity mismatch is a phenomenon in both the even mode and the odd mode of signals. In short, the signal transmission velocity of the victim channel is faster than the signal transmission velocity of the aggressor channels in the odd mode, and the signal transmission velocity of the victim channel is slower than the signal transmission velocity of the aggressor channel in the even mode. Alternatively speaking, for the victim channel, the odd mode signal propagates faster, and the even mode signal propagates slower. Such velocity mismatch causes skews of signals. As shown in FIG. 3B, transition of the aggressor channels may cause skews at the victim channel.

According to the present disclosure, how the control module 235 generates the plurality pairs of switching signals are identical for a victim channel and aggressor channels. Moreover, the following illustrations about the embodiments of the present disclosure show that the reflection crosstalk and the even/odd mode velocity mismatch issues are reduced.

Figure 4A:
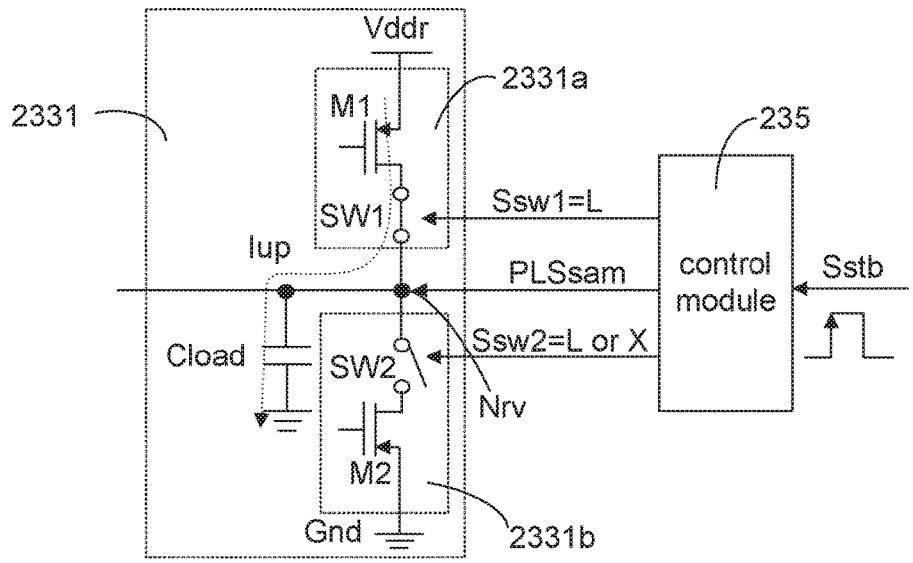
FIG. 4A is a schematic diagram illustrating the termination circuit is in a first setting mode.
Figure 4B:
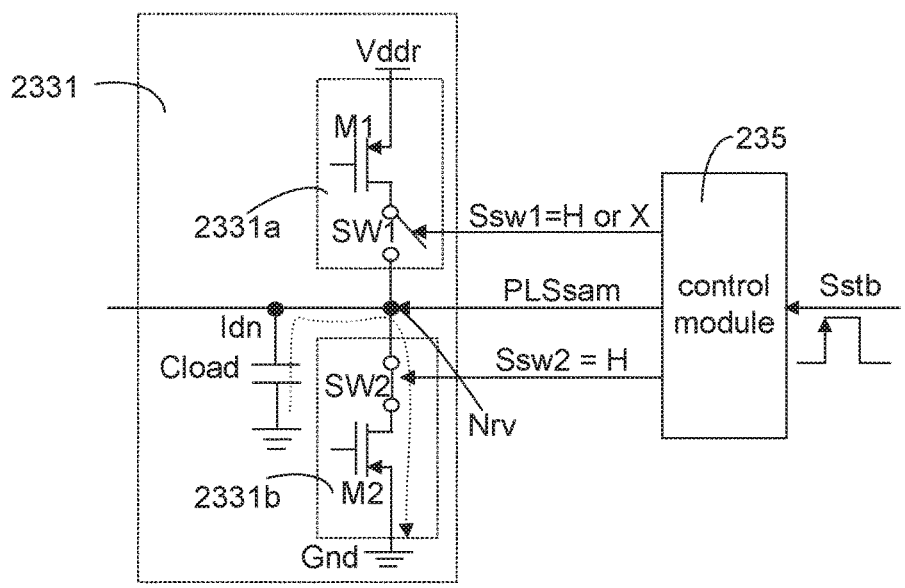
FIG. 4B is a schematic diagram illustrating the termination circuit is in a second setting mode.

FIGS. 4A and 4B are schematic diagrams illustrating the termination circuit is in a first setting mode MD1 and a second setting mode MD2, respectively. The operation of the termination circuit 2331 and its setting modes during a termination duration Tterm corresponding to the n-th data bit according the present disclosure can be summarized in Table 1. In Table 1, a voltage level of the receiving terminal Nrv can be defined as a receiving voltage Vrv.

TABLE 1

| setting mode of the termination circuit FIG. | | first setting mode MD1 FIG. 4A | second setting mode MD2 FIG. 4B |
|---|---|---|---|
| upper circuit 2331a | first switching signal Ssw1 | low voltage level | high voltage level or high impedance state |
| | switching status of first switch SW1 | ON | OFF |
| lower circuit 2331b | second switching signal Ssw2 | low voltage level or high impedance state | high voltage level |
| | switching status of second switch SW2 | OFF | ON |
| | termination operation | terminate receiving voltage Vrv to high voltage level | terminate receiving voltage Vrv to low voltage level |

As shown in Table, 1, the first column is corresponding to the first setting mode MD1 of the termination circuit 2331, and the second column is corresponding to the second setting mode MD2 of the termination circuit 2331. After receiving a strobe signal Sstb, the control module 235 generates a first switching signal Ssw1 and a second swathing signal Sw2. The voltage levels of the first switching signal Ssw1 and the second switching signal Ssw2 are utilized to determine how the receiving terminal Nrv is terminated. Please refer to FIGS. 4A and 4B and Table 1 together.

When the termination circuit 2331 is in the first setting mode MD1 during the termination duration Tterm, the receiving voltage Vrv is terminated to the high voltage level. As shown in FIG. 4A, when the first switching signal Ssw1 is at the low voltage level, an upper current Iup originating from a source voltage flows through the upper circuit 2331a. Meanwhile, the second switching signal Ssw2 is at the low voltage level of at the high impedance state, and no lower current Idn flows through the lower circuit 2331b. The upper current Iup continues to flow through the receiving terminal Nrv and a parasitic capacitor Cload, and the parasitic capacitor Cload is charged.

When the termination circuit 2331 is in the second setting mode MD2 during the termination duration Tterm, the receiving voltage Vrv is terminated to the low voltage. As shown in FIG. 4B, when the second switching signal Ssw2 is at the high voltage level, a lower current Idn originating from the parasitic capacitor Cload flows through the lower circuit 2331b. Meanwhile, the first switching signal Ss1 is at the high voltage level or at the high impedance state, and no upper current Iup flows through the upper circuit 2331a. In FIG. 4B, the parasitic capacitor Cload is discharged.

As shown in Table 1, in some applications, voltage levels of the first switching signal Ssw1 and the second switching signal Ssw2 can be equivalent. Moreover, the termination duration Tterm is defined to represent the duration when the control module 235 generates the switching signals Ssw1, Ssw2 for the n-th data bit. During the termination duration Tterm, only one of the first switch SW1 and the second switch SW2 is turned on. As for duration other than the termination duration Tterm, neither the first switch SW1 nor the second switch SW2 is turned on.

The termination duration Tterm can be slightly shorter than or equivalent to a window width Twin_pw of a window signal Swin. Alternatively speaking, the duration of the window width Twin_pw of the window signal Swin can be mostly or completely overlapped with the termination duration Tterm.

The first embodiment is an example that the termination duration Tterm is equivalent to the window width Twin_pw, and the second embodiment is an example that the termination duration Tterm is slightly shorter than the window width Twin_pw. The window width Twin_pw overlaps a transition interval Ttrs between two continuous data bits, and the cycle of the window signal Swin is equivalent to the unit interval. In some applications, the window width Twin_pw of the window signal Swin can be longer than the transition interval Ttrs. Details about how the window signal Swin is generated and the relationship between the termination duration Tterm and the window width Twin_pw will be illustrated later.

Figure 5:
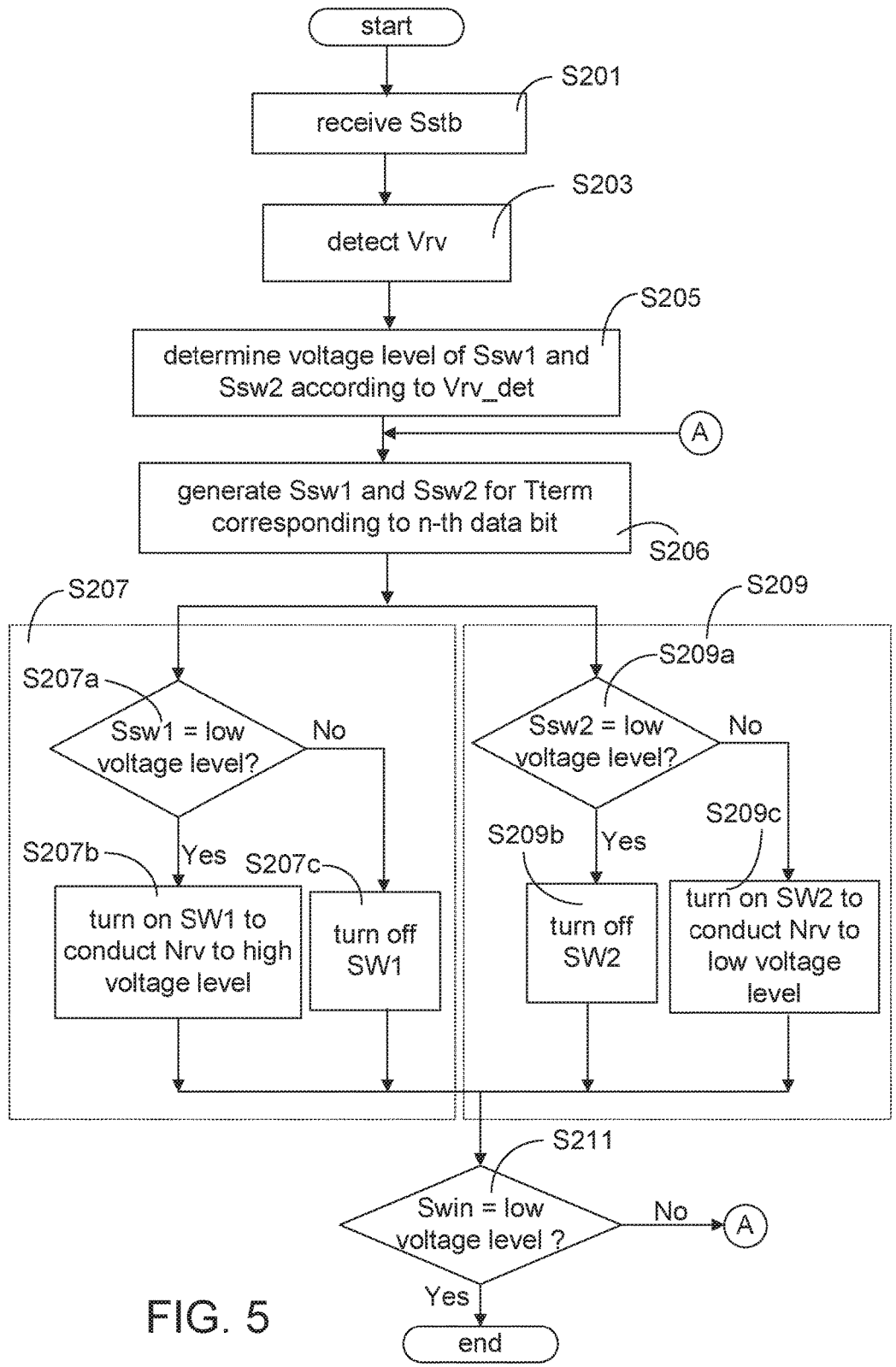
FIG. 5 is a flow diagram illustrating a terminating method applied to the termination circuit.

FIG. 5 is a flow diagram illustrating a terminating method applied to the receiver. The flow diagram is corresponding the processing procedure in which a termination circuit of the receiver performs to a data bit. As data bits are continually received, each of the termination circuits of the receiver repeatedly executes the terminating method.

Firstly, the control module 235 receives the strobe signal Sstb is received (step S201), and detects the receiving voltage Vrv during a stable interval Tstbl corresponding to an (n−1)-th data bit (that is, an (n−1)-th stable interval Tstbl) (step S203). According to the present disclosure, "n" is a positive integer. Based on the strobe signal Sstb and the detected receiving voltage Vrv_det, the control module 235 determines voltage levels of the first switching signal Ssw1 and the second switching signal Ssw2 during the termination duration Tterm corresponding to the n-th data bit (step S205) and accordingly generates the first switching signal Ssw1 and the second switching signal Ssw2 during the termination duration Tterm (step S206).

Then, the upper circuit 2331a selectively conducts the receiving terminal Nrv to the high voltage level according the to the first switching signal Ssw1 (step S207), and the lower circuit 2331b selectively conducts the receiving terminal Nrv to the low voltage level according to the second switching signal Ssw2 (step S209). In FIG. 5, steps S207 and S209 are simultaneously performed.

In step S207, voltage level of the first switching signal Ssw1 dominates the switching status of the first switch SW1 (step S207a). When the first switching signal Ssw1 is at the low voltage level, the first switch SW1 is turned on so that the receiving terminal Nrv is conducted to the high voltage level (step S207b). On the other hand, when the first switching signal Ssw1 is at the high voltage level, the first switch SW1 is turned off and no upper current Iup is generated (step S207c).

In step S209, voltage level of the second switching signal Ssw2 dominates the switching status of the second switch SW2 (step S209a). When the second switching signal Ssw2 is at the high voltage level, the second switch SW2 is turned on so that the receiving terminal Nrv is conducted to the low voltage level (step S209c). When the second switching signal Ssw2 is at the low voltage level, the second switch SW2 is turned off and no lower current Idn is generated (step S209b).

After steps S207 and S209 are performed, the control module 235 determines if the window signal Swin changes to the low voltage level (step S211). Once the window signal Swin changes to the low voltage level, the control module 235 determines the termination duration Tterm ends. If the determination result of step S211 is positive, the flow ends. Otherwise, step S206 is repeatedly executed.

Different embodiments are illustrated later. These embodiments demonstrate that how the control module 235 determines the voltage level of the first signal Sw1 and the second switching signal Ssw2 is not limited. In other words, step S205 can be implemented in different manner.

Furthermore, the control module 235 dynamically adjusts its control to the termination circuit 2331 based on the data bits being carried by the channel transmission signal. The terminating method provides control rules capable of dynamically adjusting termination of the receiving voltage Vrv. Details about how the terminating method is applied to different patterns or combinations of every two continuous data bits in the same signal channel are respectively illustrated.

A first embodiment shown in FIGS. 6-8, 9A and 9B demonstrates that the voltage level of the first signal Ssw1 and the second switching signal Ssw2 during the termination duration are controlled based on logic of the (n−1)-th data bit carried by the channel transmission signal.

For both embodiments, the logic of the (n−1)-th data bit can be obtained by detecting the receiving voltage Vrv during the stable interval Tstbl corresponding to the (n−1)-th data bit.

In addition to the (n−1)-data bit, the second embodiment shown in FIGS. 10-17 demonstrates that the receiving voltage Vrv in either the transition interval Ttrs between the (n−1)-th data bit arid the n-th data bit carried by the channel transmission signal or the n-th stable interval Tstbl is further detected. Moreover, the detected receiving voltage Vrv_det is compared with at least one threshold voltage Vth to determine the voltage level of the first signal Ssw1 and the second switching signal Ssw2 during the termination duration Tterm. For the second embodiment, the termination duration Tterm is slightly shorter than the window width Twin_pw of the window signal Swin.

Figure 6:
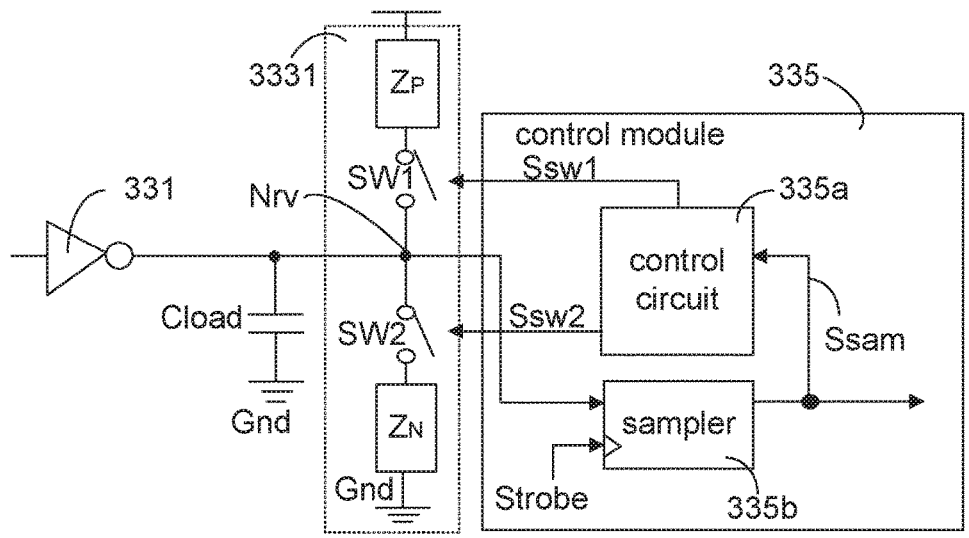
FIG. 6 is a block diagram illustrating the termination circuit according to a first embodiment of the present disclosure.

FIG. 6 is a block diagram illustrating the receiver according to a first embodiment of the present disclosure. The receiver includes a control module 335, a buffer circuit 331 and a termination circuit 3331. The control module 335 includes a control circuit 335a and a sampler 335b. The sampler 335b is coupled to the receiving terminal Nrv and the control circuit 335a. The sampler 335b receives the channel transmission signal from the receiving terminal Nrv. The sampler 335b also receives the strobe signal Sstb. According to the first embodiment, detection of the receiving voltage Vrv is performed by the sampler 335b, and the sampler 335b can be a D flip-flop.

Whenever the strobe signal Sstb rises or falls, the sampler 335b generates a sample signal Ssam representing the logic of a previous data bit (for example, the (n−1)-th data bit). Then, the control circuit 335a determines how the first switching signal Ssw1 and the second switched signal Ssw2 are generated by referring to the logic of the previous data bit.

Figure 7:
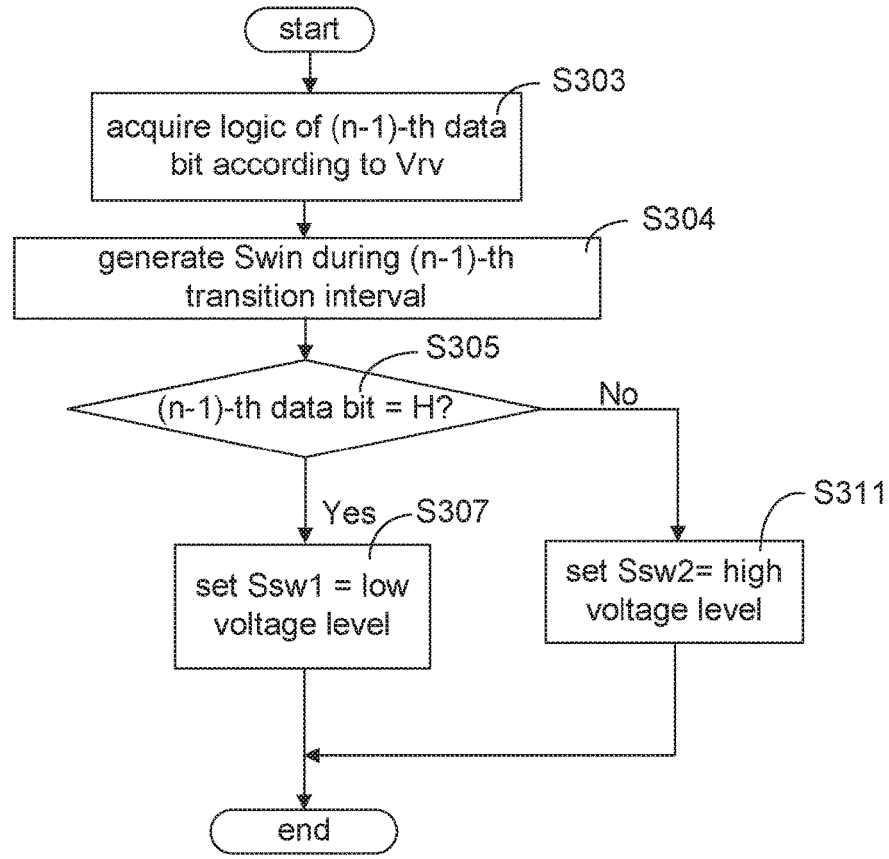
FIG. 7 is a flow diagram illustrating the terminating method applied to the termination circuit according to the first embodiment of the present disclosure.

FIG. 7 is a flow diagram illustrating how the terminating method determines the voltage level of the switching signals Ssw1, Ssw2 during the termination duration Tterm according to the detected receiving voltage Vrv_det. According to the first embodiment of the present disclosure, step S205 in FIG. 5 can further include steps shown in FIG. 7.

The sampler 335b samples the receiving voltage Vry during the stable interval Tstbl of the (n−1)-th data bit (that is, an (n−1)-th stable interval Tstbl) (step S303). In the control module 335, the window signal Swin is generated (step S304). The window width Twin_pw of the window signal Swin can be adjusted. The window width Twin_pwof the window signals Swin is required to cover the transition interval Ttrs between a previous data bit and the current data bit.

The logic of the (n−1)-th data bit is then referred by the control circuit 335a to generate the first switching signal Ssw1 and the second switching signal Ssw2.

In step S305, the control module 335 determines if the logic of the (n−1)-data bit is logic high or not. If the detected receiving voltage Vrv_det during the (n−1)-th stable interval Tstbl is at the high voltage level, the (n−1)-th data bit is logic high and the control circuit 335a sets the first switching signal Ssw1 to the low voltage level during the termination duration Tterm (step S307). If the detected receiving voltage Vry_det during the (n−1)-th stable interval Tstbl is at the low voltage level, the (n−1)-th data bit is logic low and the control circuit 335a sets the second switching signal Ssw2 to the high voltage level during the termination duration Tterm (step S311).

Figure 8:
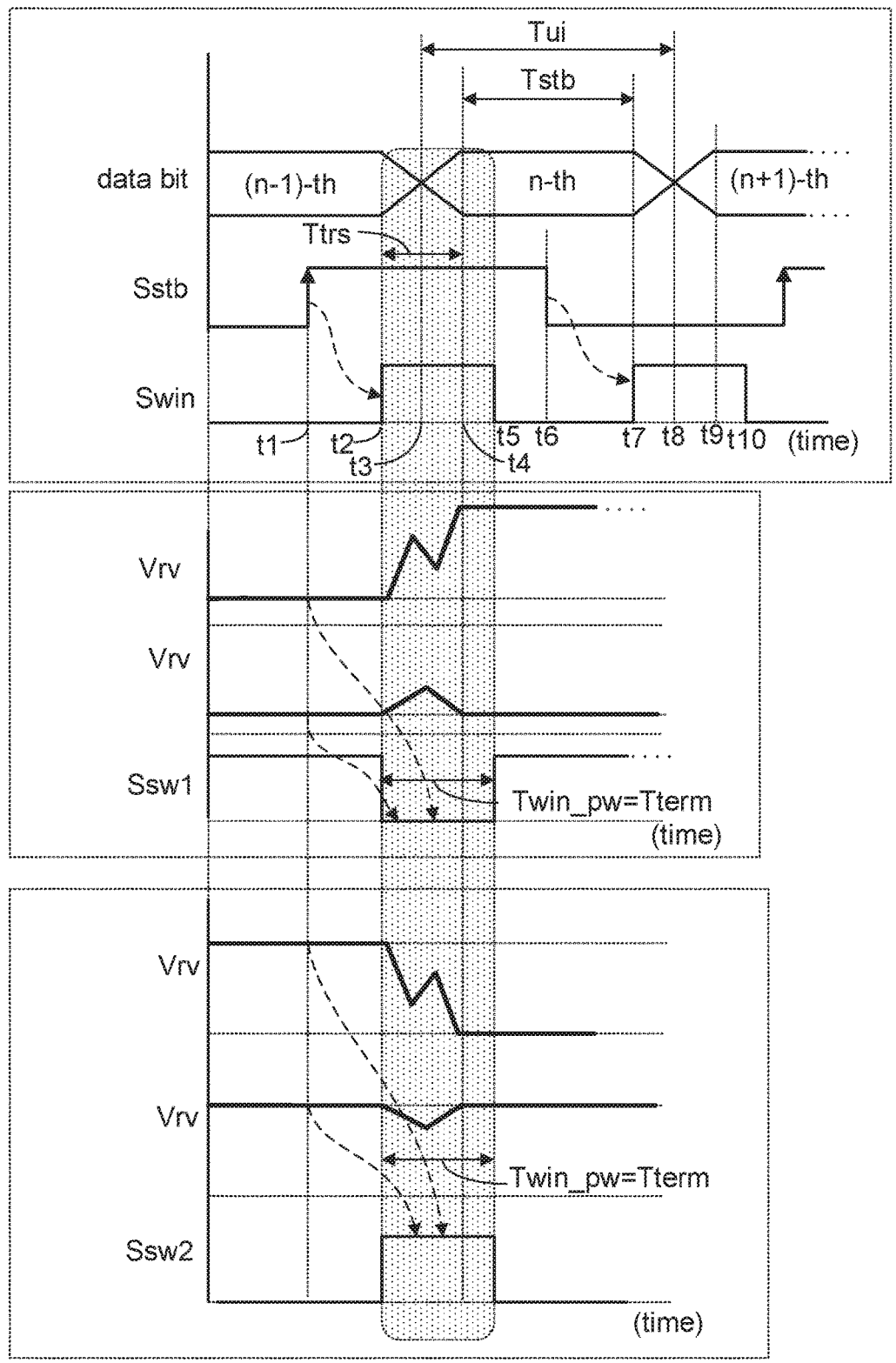
FIG. 8 is a schematic waveform diagram illustrating how the receiving terminal Nrv is conducted in response to the logic of an (n−1)-th data bit according to the first embodiment of the present disclosure.

FIG. 8 is a schematic waveform diagram illustrating how the receiving terminal Nrv is conducted in response to the logic of the (n−1)-th data bit according to the first embodiment of the present disclosure. FIG. 8 includes three portions, an upper portion representing the signals related to the control module 335, a middle portion representing occasions when the first switching signal Ssw1 is set to the low voltage level, and a lower portion representing occasions when the second switching signal Ssw2 is set to the high voltage level.

In the upper portion of FIG. 8, the data bits carried by the channel transmission signal, the strobe signal Sstb and the window signal Swin are shown. The cycle of the strobe signal Sstb is assumed to be double of the cycle of the window signal Swin, which is assumed to be equivalent to the unit interval corresponding to the data bits. Three continuous data bits are shown at the waveform representing the data pattern, that is, an (n−1)-th data bit, an n-th data bit, and an (n+1)-th data bit.

The unit interval corresponding to each of the data bits is represented as Tui. The center part of the unit interval is defined as a stable interval Tstbl. The stable interval Tstbl of a data bit represents the duration when the logic of the data bit can be correctly acquired.

The first rising edge of the strobe signal Sstb occurs at time point t1, and the second rising of the strobe signal Sstb occurs at time point t1. The window signal Swin is at the low voltage level before time point t2, between time point t5 and time point t7 and after time point t10. The window width Twin_pw of the window signal Swin is between time point t2 and time point t5, and between time point t7 and time point t10.

According to the embodiments of the present disclosure, generation of the window signal Swill is assumed to be based on significant transitions of the strobe signal Sstb. Furthermore, the window width Twin_pw needs to cover/overlap the transition interval Ttrs, and the window signal Swin can last at the high voltage level until the next rising edge of the strobe signal Sstb.

In the middle portion of FIG. 8, the two waveforms represent the occasions that the channel transmission signal should be set to the high voltage level during the termination duration Tterm according to the first embodiment. In order to do so, the first switching signal Ssw1 is set to the low voltage level between time point t2 and time point t4.

The first waveform of the middle portion of FIG. 8 is corresponding to the case that the (n−1)-th data bit is logic low and the n-th data bit is logic high. For such case, the channel transmission signal transits from the low voltage level to the high voltage level during the (n−1)-th transition interval Ttrs and no dc current is generated. In other words, the receiving voltage Vrv is directed to the high voltage level prior to the n-th stable interval Tstbl.

The second waveform of the middle portion of FIG. 8 is corresponding to the case that both the (n−1)-th data bit and the n-th data bit are logic low. For such case, the channel transmission signal remains at the low voltage level during the (n−1)-th transition interval Ttrs. During the termination duration Tterm, the termination circuit 333 conducts the receiving terminal Nrv to the high voltage level, which is opposite to the voltage level of the channel transmission signal. The receiving voltage Vrv is thus slightly affected, and small fluctuation occurs at the receiving voltage Vrv during the (n−1)-th transition interval Ttrs.

The third waveform of the middle portion of FIG. 8 represents how the voltage level of the first switching signal Ssw1 is controlled when the (n−1)-th data bit is logic low. The first switching signal Ssw1 is set to the high voltage level before time point t2 and after time point t5, and the first switching signal Ssw1 is set to the low voltage level during the termination duration Tterm. As illustrated above, the termination duration Tterm is equivalent to the window width Twin_pw of the window signal Swin in the first embodiment.

In the lower portion of FIG. 8, the two waveforms represent the occasions that the (n−1)-th data bit is logic high and the channel transmission signal should be set to the low voltage level according to the first embodiment. Therefore, the first switching signal Ssw1 is set to the high voltage level between time point t2 and time point t4.

The first waveform of the lower portion of FIG. 8 is corresponding to the case that the (n−1)-th data bit is logic high and the n-th data bit is logic low. For such case, the channel transmission signal transits from the high voltage level to the low voltage level during the transition interval Ttrs and no dc current is generated. In other words, the receiving voltage Vrv is directed to the low voltage level prior to the n-th stable interval Tstbl.

The second waveform of the lower portion of FIG. 8 is corresponding to the case that both the (n−1)-th data bit and the n-th data bit are logic high. For such case, the receiving voltage Vrv needs to remain as the high voltage level during the (n−1)-th transition interval Ttrs. During the termination duration Tterm, the termination circuit 333 conducts the receiving terminal Nrv to the low voltage level, which is opposite to the voltage level of the channel transmission signal. The receiving voltage Vrv is thus slightly affected, and small fluctuation occurs during the (n−1)-th transition interval Ttrs.

The third waveform of the lower portion of FIG. 8 represents how the voltage level of the second switching signal Ssw2 is controlled when the (n−1)-th data bit is logic high. The second switching signal Ssw2 is set to the low voltage level before time point t2 and after time point t5, and the second switching signal Ssw2 is set to the high voltage level during the termination duration Tterm. As illustrated above, the termination duration Tterm is equivalent to the window width Twin_pw of the window signal Swin in the first embodiment.

Figure 9A:
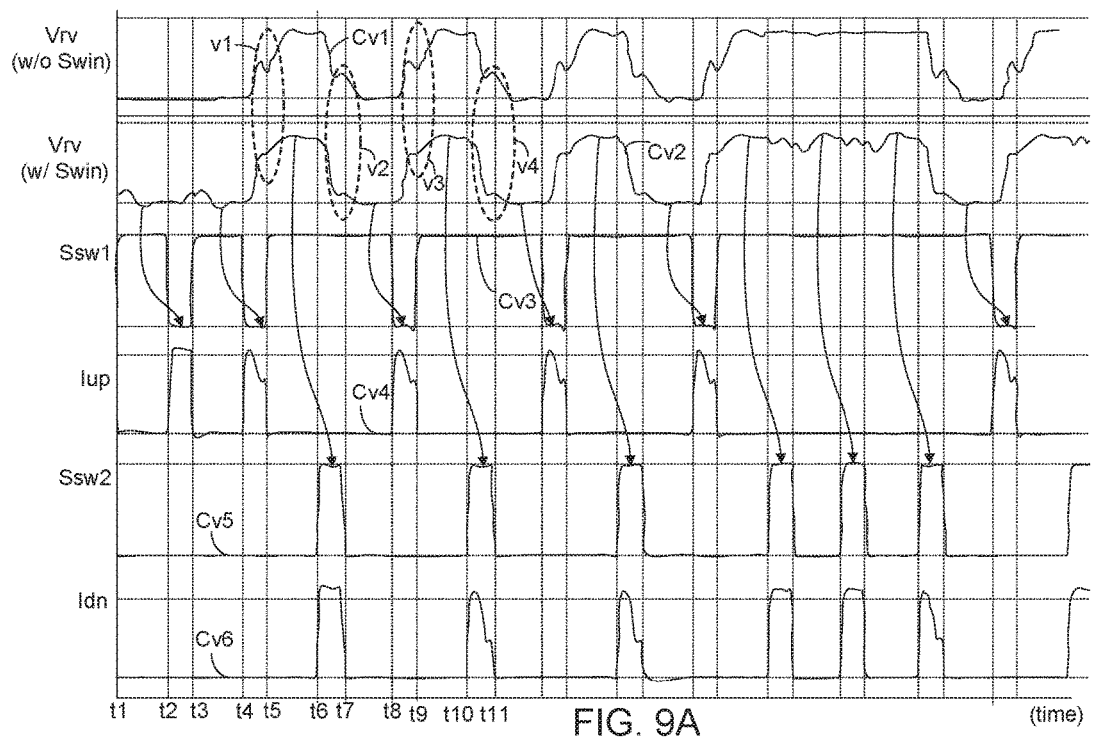
FIG. 9A is a schematic waveform diagram illustrating operations of the termination circuit being used with the victim channel.

FIG. 9A is a schematic waveform diagram illustrating operations of the termination circuit being used with the victim channel. The first waveform Cv1 is the receiving voltage Vrv corresponding to the conventional case that no switching signal is utilized. The second waveform Cv2 is the receiving voltage Vrv corresponding to the case when the window signal Swin is applied. A series of data bits (0010101111101) being transmitted through the victim channel are shown in FIG. 9A. The stable interval Tstbl corresponding to the first data bit "0" is between time point t1 and time point t2, the stable interval Tstbl corresponding to the second data bit "0" is between time point t3 and time point t4, the stable interval Tstbl corresponding to the third data bit "1" is between time point t5 and time point t6, and so forth.

The third waveform Cv3 and the fourth waveform Cv4 in FIG. 9A represent signals related to the upper circuit 2331a, and the fifth waveform Cv5 and the sixth waveform Cv6 in FIG. 9A represent signals related to the lower circuit 2331b.

The arrows shown in FIG. 9A represents the relationships between waveforms representing the receiving voltage Vrv and the first and the second switching signals Ssw1, Ssw2. The leftmost arrow is illustrated as an example. Between time point t1 and t2, the receiving voltage Vrv shown by the second waveform Cv2 is at the low voltage level. This implies that the (n−1)-th data bit is logic low and the termination circuit 3331 should operate in the first setting mode MD1 in the coming stable interval Tstbl. Therefore, the first switching signal Ssw1 as shown by the third waveform Cv3 is set at the low voltage level and the upper current Iup as shown by the fourth waveform Cv4 accordingly generates. Meanwhile, the second switching signal Ssw2 as shown by the fifth waveform Cv5 is assumed to be set to the low voltage level and the lower current Idn as shown by the sixth waveform Cv6 is not generated.

In FIG. 9A, dotted circles v1, v2, v3, v4 can be used to compare the amplitudes of the receiving voltage Vrv of the victim channel without and with the window signal Swin.

Between time point t4 and time point t5 and between time point t8 and time point t9, the channel transmission signal of the victim channel is in transition, that is, the receiving voltage Vrv starts to change from the low voltage level to the high voltage level because of the data bit transition. The dotted circle v1 shows that the amplitude of the receiving voltage Vrv without the window signal Swin is lower than that with the window signal Swin at time point t5. Between time point t5 and time point t6, the high voltage level of the receiving voltage Vrv represents that the n-th data bit is logic high. In other words, the amplitude of the receiving voltage Vrv becomes closer to the voltage level corresponding to the logic of the n-th data bit if the window signal Swin is utilized and the switching signals Ssw1, Ssw2 are generated.

Furthermore, the amplitude difference between the receiving voltages Vrv without and with the window signal Swin at time point t5 proves that the termination circuit with the window signal Swin based control mechanism allows the victim channel to be less affected by the aggressor channels in the odd mode. Similarly, the dotted circle v3 demonstrates that the similar phenomenon also occurs at time point t9.

Between time point t6 and time point t7 and between time point t16 and time point t11, the channel transmission signal of the victim channel is in transition, that is, the receiving voltage Vrv starts to change from the high voltage level to the low voltage level. The dotted circle v2 shows that the amplitude of the receiving voltage Vrv without the window signal Swin is greater than that with the window signal Swin at time point t7. Between time point t7 and time point t8, the low voltage level of the receiving voltage Vrv represents that the n-th data bit is logic low. In other words, the amplitude of the receiving voltage Vrv becomes closer to the voltage level corresponding to the logic of the n-th data bit if the window signal Swin is utilized and the switching signals Ssw1, Ssw2 are generated.

Furthermore, the amplitude difference between the receiving voltages Vrv without and with the window signal Swin at time point t7 proves that the termination circuit with the window signal Swin based control mechanism allows the victim channel to be less affected by the aggressor channels in the odd mode. Similarly, the dotted circle v4 demonstrates that the similar phenomenon occurs at time point t11.

Figure 9B:
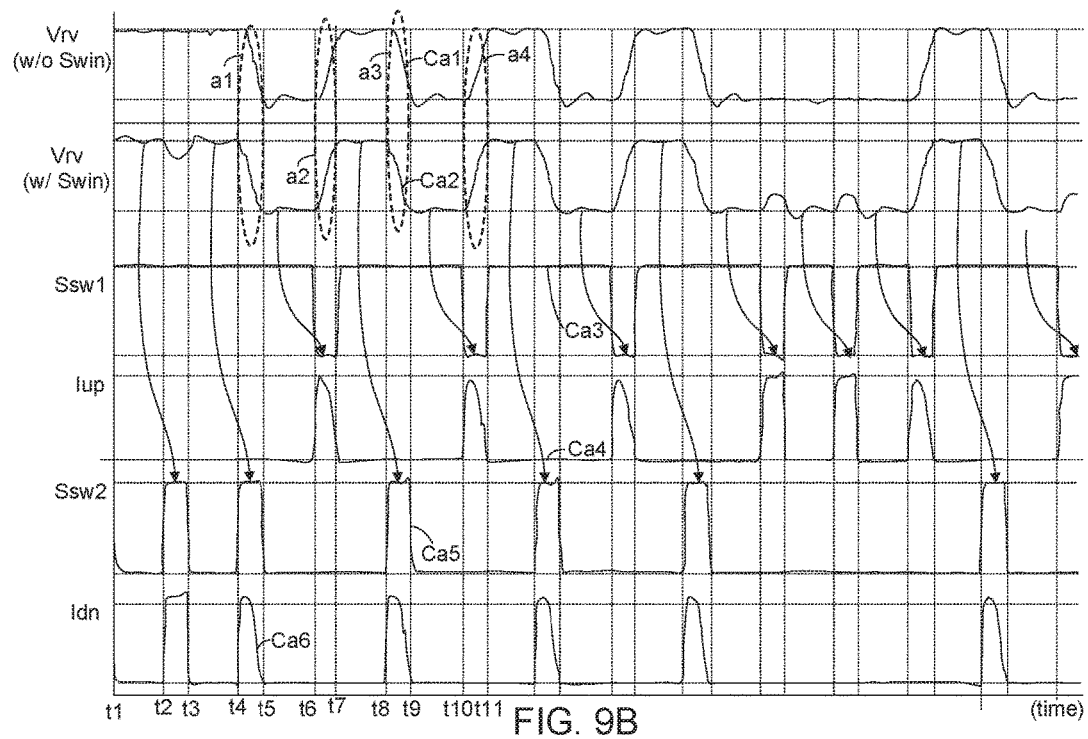
FIG. 9B is a schematic waveform diagram illustrating operations of the termination circuit being used with the aggressor channel.

FIG. 9B is a schematic waveform diagram illustrating operations of the termination circuit being used with the aggressor channel. The signal channels shown in FIGS. 9A and 9B are corresponding to the odd mode cases, and the data bits (1101010000010) carried by the channel transmission signal shown in FIG. 9B are opposite to the ones in FIG. 9A. The stable interval Tstbl corresponding to the first data bit "1" is between time point t1 and time point t2, the stable interval Tstbl corresponding to the second data bit "1" is between time point t3 and time point t4, the stable interval Tstbl corresponding to the third data bit "0" is between time point t5 and time point t6, and so forth.

According to the present disclosure, the terminating method applied to the termination circuits connected to the victim channel and the aggressor channels are identical. That is, how the receiving voltage Vrv is sampled or detected and how the first switching signal Ssw1 and the second switching signal Ssw2 are generated are identical for all signal channels. Therefore, the design of the termination circuit can suit various types of signal channels. As the data bits of the aggressor channel in FIG. 9B are opposite to the ones of the victim channel in FIG. 9B, the operations of the first switching signals Ssw1 shown in FIGS. 9A and 9B are compensated, so as the second switching signals Ssw2.

In FIG. 9B, dotted circles a1, a2, a3, a4 are used to compare the amplitudes of the receiving voltage Vrv of the aggressor channel without and with the window signal Swin.

Between time point t4 and time point t5 and between time point t8 and time point t9, the channel transmission signal of the aggressor channel is in transition, that is, the receiving voltage Vrv starts to change from the high voltage level to the low voltage level. Between time point t4 and time point t5, the dotted circle a1 shows that amplitude of the receiving voltage Vrv without the window signal Swin being applied to is lower than that with the window signal being applied to. That is, the receiving voltage Vrv becomes closer to the voltage level corresponding to the n-th data bit if the window signal Swin based control mechanism is used. Based on the illustrations above, the receiving voltage Vrv of the aggressor channel being applied with the window signal Swin changes faster than the one not being applied with the window signal Swin.

Furthermore, the amplitude difference between the receiving voltages Vrv without and with the window signal Swin between time point t4 and time point t5 proves that application of the window signal Swin allows the aggressor channel to increase its propagation velocity. As propagation velocity of the aggressor channel is increased, the velocity mismatch between the victim channel and the aggressor channel is reduced. Similarly, the dotted circle a3 demonstrates that the same phenomenon exists between time point t8 and time point t9.

Between time point t6 and time point t7 and between time point t10 and time point t11, the signal of the aggressor channel is in transition, that is, the receiving voltage Vrv starts to change from the low voltage level to the high voltage level. Between time point t6 and time point t7, the dotted circle a2 shows that amplitude of the receiving voltage Vrv without the window signal Swin being applied to is greater than that with the window signal Swin being applied to. That is, the receiving voltage Vrv becomes closer to the voltage level corresponding to the n-th data bit if the window signal Swin based control mechanism is used.

Furthermore, the amplitude difference between the receiving voltages Vrv without and with the window signal Swin between time point t6 and time point t7 proves that application of the window signal Swin allows the aggressor channel to increase its propagation velocity. As propagation velocity of the aggressor channel is increased, the velocity mismatch between the victim channel and the aggressor channel is reduced. Similarly, the dotted circle v4 demonstrates that the similar phenomenon occurs between time point t10 and time point t11.

Figure 10:
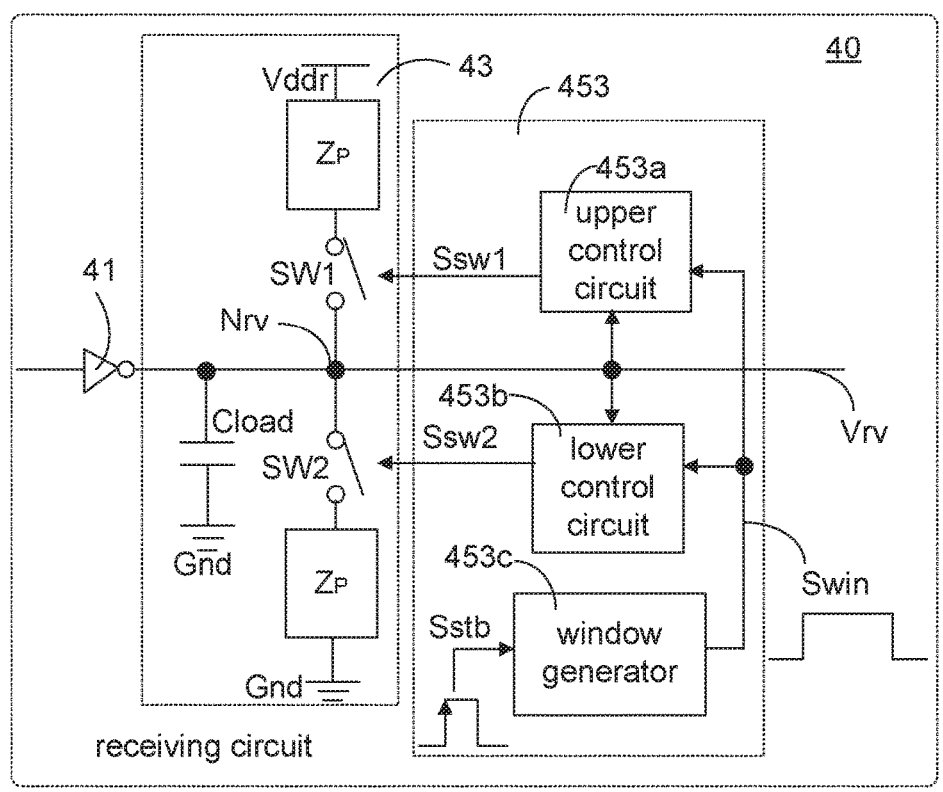
FIG. 10 is a block diagram illustrating the receiver according to a second embodiment of the present disclosure.

FIG. 10 is a block diagram illustrating the receiver according to a second embodiment of the present disclosure. The receiving circuit 40 includes a buffer circuit 41, a termination circuit 43, and a control module 453. The control module 453 includes an upper control circuit 453a and a lower control circuit 453b for generating the first switching signal Ssw1 and the second switching signal Ssw1, respectively. In some applications, the functions of the upper control circuit 453a and the lower control circuit 453b may be integrated together. The control module 453 further includes a window generator 453c. The window generator 453c receives the strobe signal Sstb and generates a window signal Swin based on significant transitions of the strobe signal Sstb.

According to the second embodiment, detection of the receiving voltage Vry can be performed by the upper control circuit 453a and the lower control circuit 453b during the (n−1)-th transition interval Ttrs or the n-th stable interval Tstbl.

The upper control circuits 453a and the lower control circuit 453b compare the detected receiving voltage Vrv with at least one threshold voltage Vth. According to the comparison result, the upper control circuit 453a may generate the first switching signal Ssw1 for the termination duration Tterm and the lower control circuit 453b may generate the second switching signal Ssw2 for the termination duration Tterm.

Figure 12:
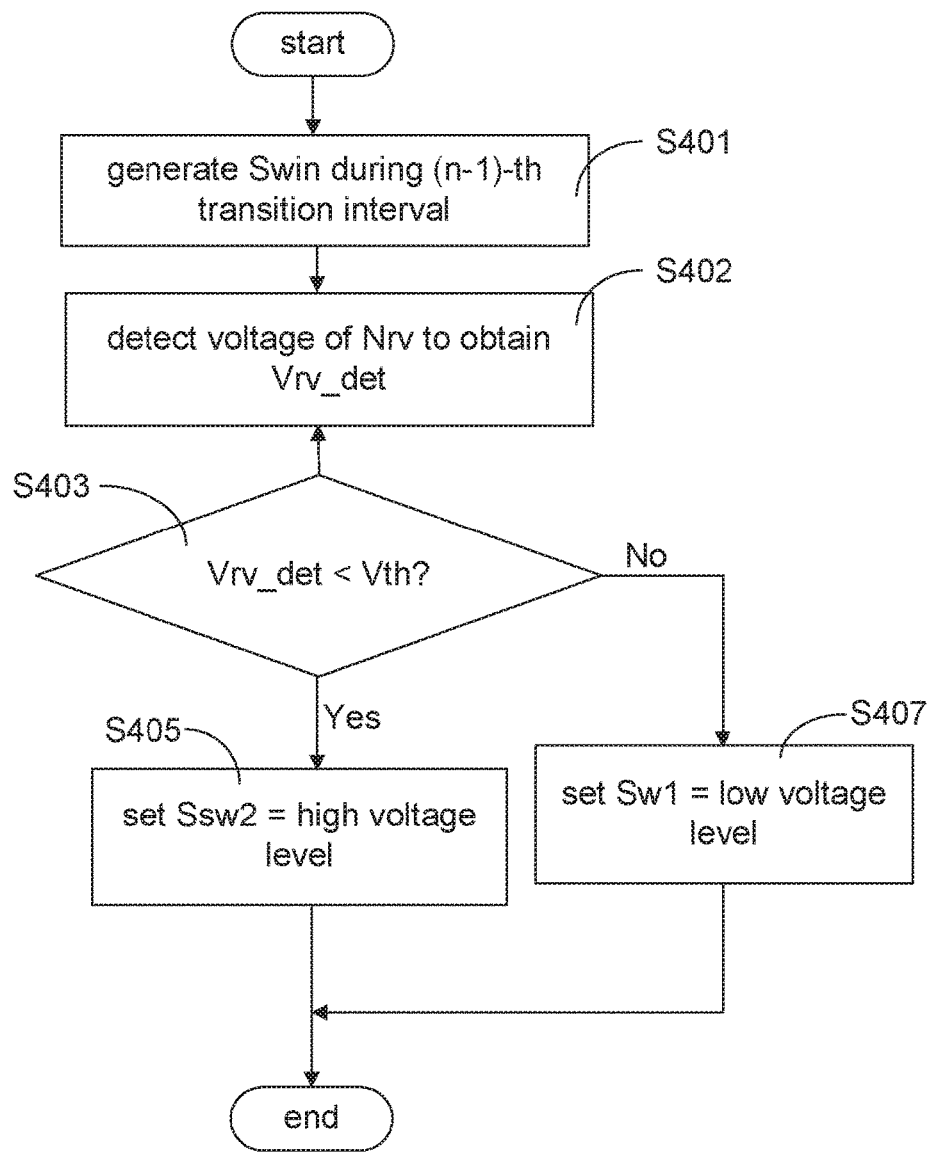
FIG. 12 is a flow diagram illustrating a type of the terminating method applied to the receiver according to the second embodiment of the present disclosure.
Figure 13:
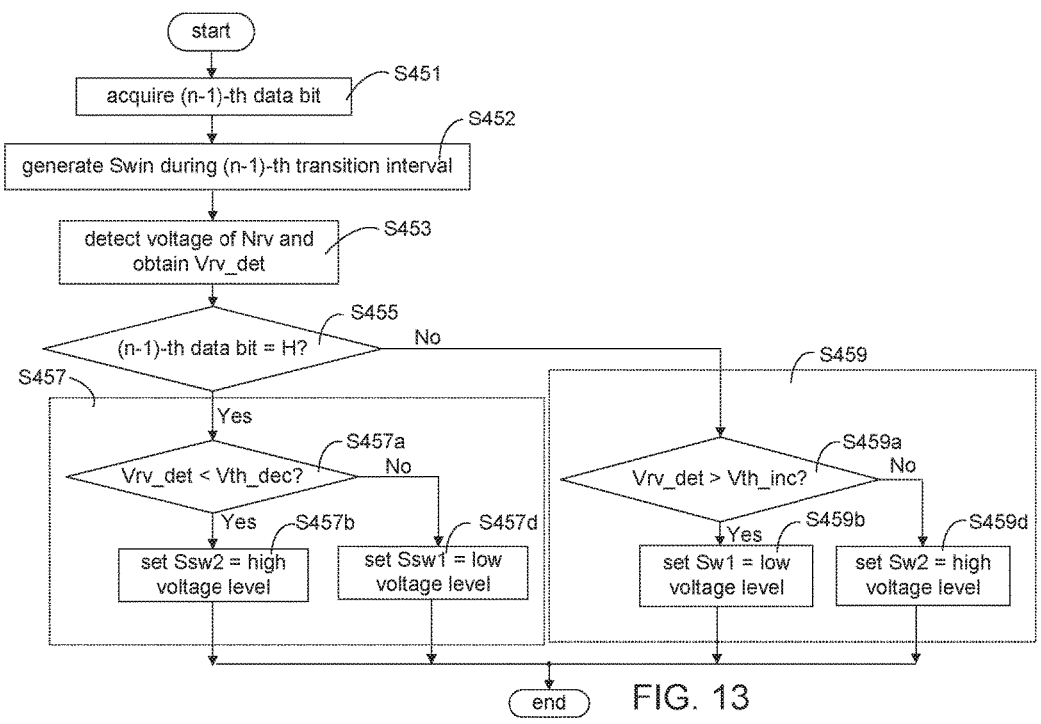
FIG. 13 is a flow diagram illustrating another type of the terminating method applied to the receiver circuit according to the second embodiment of the present disclosure.

Value selection and number of the threshold voltage Vth are not limited and implementation of the upper control circuit 453a and the lower control circuit 453b may vary. FIG. 12 is an example that one threshold voltage Vth is predefined and FIG. 13 is an example that two threshold voltages (Vth_inc, Vth_dec) are predefined.

Figure 11:
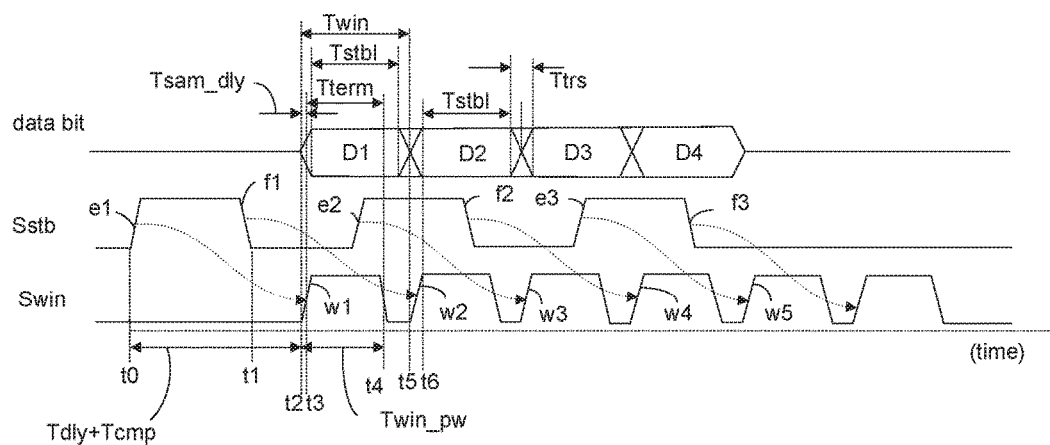
FIG. 11 is a schematic waveform diagram illustrating generation of the window signal Swin.

FIG. 11 is a schematic waveform diagram illustrating generation of the window signal Swin. The first waveform represents the data bits carried by the channel transmission signal, the second waveform represents the strobe signal Sstb, and the third waveform represents the window signal Swin.

The strobe signal Sstb has a pre-toggle pulse (that is, the first pulse of the strobe signal Sstb between time point t0 and time point t1) so that the first window width Twin_pw of the window signal Swin can be generated for the first data bit D1.

The unit interval of the first data bit D1 is between time point t2 and time point t5, which is equivalent to the cycle of the window signal Swin. The first window width Twin_pw of the window signal Ssin covers the transition interval Ttrs before the stable interval Tstbl of the first data bit D1, and the receiving voltage Vrv is detected after time point t2 (that is, the first rising edge of the window signal Swin) but before the stable interval Tstbl corresponding to the first data bit D1 starts.

The duration between time point to and time point t2, that is, the first rising edge e1 of the strobe signal Sstb and the rising edge of the first pulse w1 of the window signal Swin, is a duration caused by a component delay duration Tcmp and a window delay duration Tdly. The component delay duration Tcmp represents the delay caused by related components and is assumed to be constant in this context. The window delay duration Tdly is a duration being inserted so that the window signal Swin can be synchronized with the beginning of the data bits. Duration between time point t2 and time point t3 (that is, the sample delay duration Tsam_dly) is set to represent the timing when the receiving voltage Vrv should be detected by the control module 453. Later, the detected receiving voltage Vrv_det is compared with the threshold voltage, and the comparison result is referred to generate the first switching signal Ssw1 and the second switching signal Ssw2. In order to determine the voltage level of the first switching signal Ssw1 and the second switching signal Ssw2 during the termination duration Tterm as quickly as possible, the receiving voltage Vrv is desired to be detected soon after the channel transmission signal is in the transition interval Ttrs. Therefore, the sample delay duration Tsam_dly is preferred to be relatively short.

In a case that the termination duration Tterm is slightly shorter than the window width Twin_pw of the window signal Swin, the window width Twin_pw of the window signal Swin is equivalent to summation of the termination duration Tterm and a sample delay duration Tsam_dly.

The first rising edge e1 of the strobe signal Sstb occurs at time point to, and the first rising edge e1 of the strobe signal Stb is related to generation of the first pulse of the window signal Swin. The first rising edge of the window signal Swin is at time point t2, and the control module 453 detects the receiving voltage Vrv at time point t3. The first pulse w1 of the window signal Swin lasts until time point t4.

The first falling edge f1 of the strobe signal Sstb occurs at time point t1, and the second falling edge f2 of the strobe signal Sstb is related to generation of the second pulse w2 of the window signal Swin. The second rising edge of the window signal Swin occurs at time point t5, and the control module detects the receiving voltage Vrv at time point t6. Similarly, the second rising edge e2 of the strobe signal Sstb is related to generation of the third pulse w3 of the window signal Swin, and the second falling edge f2 of the strobe signal Sstb is related to generation of the fourth pulse w4 of the window signal Swin.

FIG. 12 is a flow diagram illustrating an example of the terminating method applied to the receiver according to the second embodiment of the present disclosure. According to the first example of the second embodiment of the present disclosure, step S205 in FIG. 5 can further include steps shown in FIG. 12.

Firstly, the control module 453 generates the window signal Swin during the (n−1)-th transition interval Ttrs (step S401), and detects the voltage of the receiving terminal Nrv to obtain the receiving voltage Vrv_det during the (n−1)-th transition interval Ttrs or the n-th stable interval Tstbl (step S402). Later, and the control module 453 compares the detected receiving voltage Vrv_olet with a threshold voltage Vth(step S403). The threshold voltage Vth can be for example, Vdd/2.

If the detected receiving voltage Vrv_det during the (n−1)-th transition interval Ttrs or the n-th stable interval Tstbl is lower than the threshold voltage Vth, the lower control circuit 453b generates the logic high of the second switching signal Ssw2 (step S405). Meanwhile, the first switching signal Ssw1 can be set to the high voltage level or the high impendence state for the termination duration Tterm corresponding to the n-th data bit.

If the detected receiving voltage Vrv_det during the (n−1)-th transition interval Ttrs or the n-th stable interval Tstbl is greater than the threshold voltage Vth, the upper control circuit 453a generates the logic low of the first switching signal Ssw1 (step S407). Meanwhile, the second switching signal Ssw2 can be set to the high voltage level or the high impendence state for the termination duration Tterm corresponding to the n-th data bit.

In FIG. 12, only one threshold voltage Vth is set for comparison purpose. In FIG. 13, two threshold voltages (a first threshold voltage Vth_dec and a second threshold voltage Vth_inc) are set for comparison. By comparing the voltage level of the detected receiving voltage Vrv_det and these threshold voltages, logic of the current data bit carried by the channel transmission signal can be determined. Similarly, by comparing the voltage level of the detected receiving voltage Vrv_det and these threshold voltages, logic of the next data bit carried by the channel transmission signal can be determined. In practical applications, the detected receiving voltage Vrv_det can be detected in either the transition interval Ttrs between the current data bit (for example, the n-th data bit) and the next data bit (for example, the (n+1)-th data bit) or the stable interval Tstble corresponding to the nth data bit.

The first threshold voltage Vth_dec is used to determine whether the channel transmission signal tends to decrease to the low voltage level, and the second threshold voltage Vth_inc is used to determine whether the channel transmission signal tends to increase to the high voltage level. The first threshold voltage Vth_dec is greater than the second threshold voltage Vth_inc. In practical application, number of the threshold voltages is not limited.

FIG. 13 is a flow diagram illustrating another example of the terminating method applied to the receiver according to the second embodiment of the present disclosure.

Firstly, the upper control circuit 453a and the lower control circuit 453b acquire the logic of the (n−1)-th data bit (step S451), and the window generator 453c generates the window signal Swin during the (n−1)-th transition interval (step S452). The upper control circuit 453a and the lower control circuit 453b detect the receiving voltage Vrv (step S453). The transition interval Ttrs is between a stable interval Tstbl of the (n−1)-th data bit and a stable interval Tstbl of the n-th data bit and can be defined as an (n−1)-th transition interval Ttrs. Then, the upper control circuit 453a and the lower control circuit 453b 453 determine if the (n−1)-th data bit is logic high (Step S455).

Figure 14A:
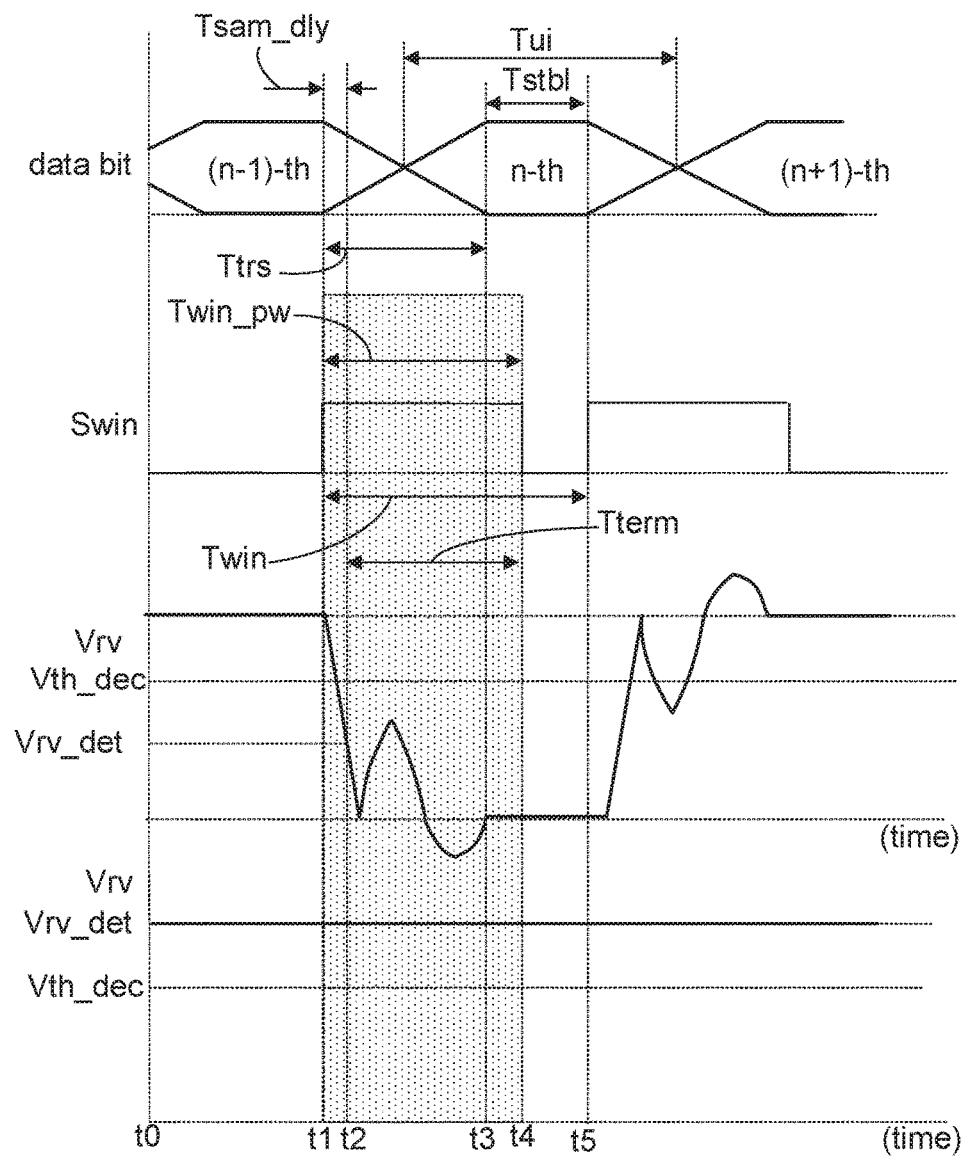
FIG. 14A is a schematic waveform diagram illustrating operations of the termination circuit when the (n−1)-th data bit is logic high according to the second embodiment.

If the (n−1)-th data bit is logic high, the upper control circuit 453a and the lower control circuit 453b respectively generate the first and the second switching signals Ssw1, Ssw2 based on comparison between the first threshold voltage Vth_dec and the detected receiving voltage Vrv_det (step S457). The waveforms related to this case are shown in FIG. 14A.

Step S457 further includes following steps. Firstly, the upper control circuit 453a and the lower control circuit 453b determine if the detected receiving voltage Vrv_det is lower than or equivalent to the first threshold voltage Vth_dec (step S457a).

If the determination result of step S457a is positive, the lower control circuit 453b sets the second switching signal Ssw2 to the high voltage level during the (n−1)-th termination duration Tterm (step S457b). Meanwhile, the upper control circuit 453a may set the first switching signal Ssw1 to the high voltage level or the high impendence state during the (n−1)-th termination duration Tterm. Therefore, the termination circuit 4331 is in the second setting mode MD2 during the termination duration Tterm corresponding to the n-th data bit.

If the determination result of step S457a is negative, the upper control circuit 453a sets the first switching signal Ssw1 to the low voltage level during the (n−1)-th termination duration Tterm (step S457d). Meanwhile, the lower control circuit 453b may set the second switching signal Ssw2 to the low voltage level or the high impendence state during the (n−1)-th termination duration Tterm. Therefore, the termination circuit 4331 is in the first setting mode MD1 during the termination duration Tterm corresponding to the n-th data bit.

Figure 14B:
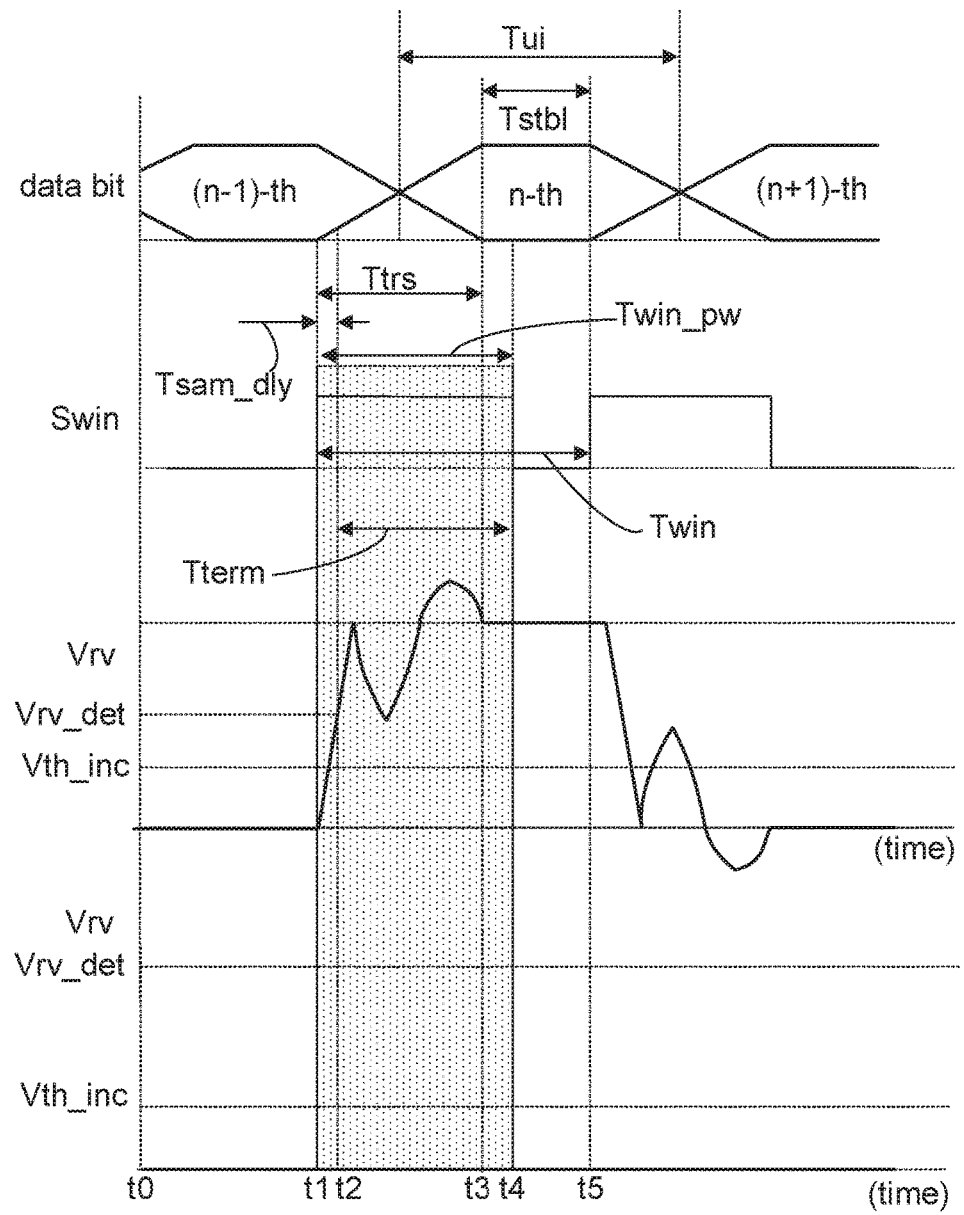
FIG. 14B is a schematic waveform diagram illustrating operations of the termination circuit when the (n−1)-th data bit is logic low according to the second embodiment.

If the (n−1)-th data bit is logic low, the upper control circuit 453a and the lower control circuit 453b generate the first and the second switching signals Ssw1, Ssw2 based on comparison between a second threshold voltage Vth_inc and the detected receiving voltage Vrv_det (step S459). The waveforms related to step S459 are shown in FIG. 14B.

Step S459 further includes following steps. Firstly, the upper control circuit 453a and the lower control circuit 453b determine if the detected receiving voltage Vrv_det is greater than or equivalent to the second threshold voltage Vth_inc (step S459a).

If the determination result of step S459a is positive, the upper control circuit 453a sets the first switching signal Ssw1 to the low voltage level during the (n−1)-th termination duration Tterm (step S459b). Meanwhile, the lower control circuit 453b may set the second switching signal Ssw2 to the low voltage level or at the high impendence state during the (n−1)-th termination duration Tterm. Therefore, the termination circuit 4331 is in the first setting mode MD1 during the termination duration Tterm corresponding to the n-th data bit.

If the determination result of step S459a is negative, the lower control circuit 453b sets the second switching signal Ssw2 to the high voltage level during the (n−1)-th termination duration Tterm (step S459d). Meanwhile, the upper control circuit 453a may set the first switching signal Ssw1 to the high voltage level or at a high impendence state during the (n−1)-th termination duration Tterm. Therefore, the termination circuit 4331 is in the second setting mode MD2 during the termination duration Tterm corresponding to the n-th data bit.

FIG. 14A is a schematic waveform diagram illustrating operations of the termination circuit when the (n−1)-th data bit is logic high according to the second embodiment.

In FIG. 14A, the first waveform represents the data bits carried by the channel transmission signal, the second waveform represents the window signal Swin. The period of the window signal Swin is represented as Twin. Three data bits, that is, an (n−1)-th data bit, an n-th data bit, and an (n+1)-th data bit, are shown at the waveform representing the receiving voltage Vrv.

The transition interval Ttrs between the (n−1)-th data bit and the n-th data bit is between time point t1 and time point t3. The receiving voltage Vrv is firstly detected at time point t2, which is shortly after the first pulse of the window signal Swin starts. The detected receiving voltage Vrv_det is utilized to analyze the tendency of the data transition.

Between time point to t0 time point t5, the third waveform in FIG. 14A is corresponding to the scenario of step S457b in FIG. 13. When the (n−1)-th data bit (between time point to t0 time point t1) is logic high and the detected receiving voltage Vrv_det is lower than the first threshold voltage Vth_dec, the termination circuit 4331 is in the setting mode MD2 during the termination duration Tterm (between time point t2 and time point t4). Between time point t4 and time point t5, the receiving voltage Vrv shown by the third waveform is at the low voltage level. Therefore, the receiving voltage Vrv gradually shifts from the high voltage level to the low voltage level during time point t1 to time point t4.

Based on the tendency that the receiving voltage Vrv decreases, the control module 453 sets the second switching signal Ssw2 to the high voltage level so that the lower current Idn is generated to speed up dropping of the receiving voltage Vrv during the transition interval Ttrs.

Between time point t0 to time point t5, the fourth waveform in FIG. 14A is corresponding to the scenario of step S457d in FIG. 13. When the (n−1)-th data bit is logic high and the detected receiving voltage Vrv_det is higher than the first threshold voltage Vth_dec, the termination circuit 4331 is in the first setting mode MD1 during the termination duration (between time point 2 and time point t4). Between time point t4 and time point t5, the receiving voltage Vrv shown by the fourth waveform is at the high voltage level. Therefore, the receiving voltage Vrv remains at the high voltage level during time point t1 to t4.

FIG. 14B is a schematic waveform diagram illustrating operations of the termination circuit when the (n−1)-th data bit is logic low according to the second embodiment. The first two waveforms in FIG. 14B are similar to the ones in FIG. 14A and not redundantly illustrated.

Between time point t0 to time point t5, the third waveform in FIG. 14B is corresponding to the scenario of step S459b in FIG. 13. When the (n−1)-th data bit is logic low and the detected receiving voltage Vrv_det is greater than the second threshold voltage Vth_inc, the termination circuit 4331 is in the first setting mode MD1 during the termination duration Tterm (between time point t2 and time point t4). Then, the upper circuit conducts the receiving voltage Vrv to the high voltage level. Between time point t4 and time point t5, the receiving voltage Vrv shown by the third waveform is at the high voltage level. Therefore, the receiving voltage Vrv gradually shifts from the low voltage level to the high voltage level during time point t1 to t4. Based on the tendency that the receiving voltage Vrv increases, the control module 453 sets the first switching signal Ssw1 to the low voltage level so that the upper current Idn is generated to speed up rising of the receiving voltage Vrv during the termination duration Tterm.

Between time point t0 to time point t5, the fourth waveform in FIG. 14B is corresponding to the scenario of step S459d in FIG. 13. When the (n−1)-th data bit is logic high and the detected receiving voltage Vrv_det is lower than the second threshold voltage Vth_inc, the termination circuit 4331 is in the second setting mode MD2 during the termination duration Tterm (between time point t2 and time point t4). Then, the lower circuit conducts the receiving voltage Vrv to the low voltage level. Between time point t4 and time point t5, the receiving voltage Vrv shown by the fourth waveform is at the low voltage level. Therefore, the receiving voltage Vrv remains at the low voltage level during time point t1 to time point t5.

Figure 15:
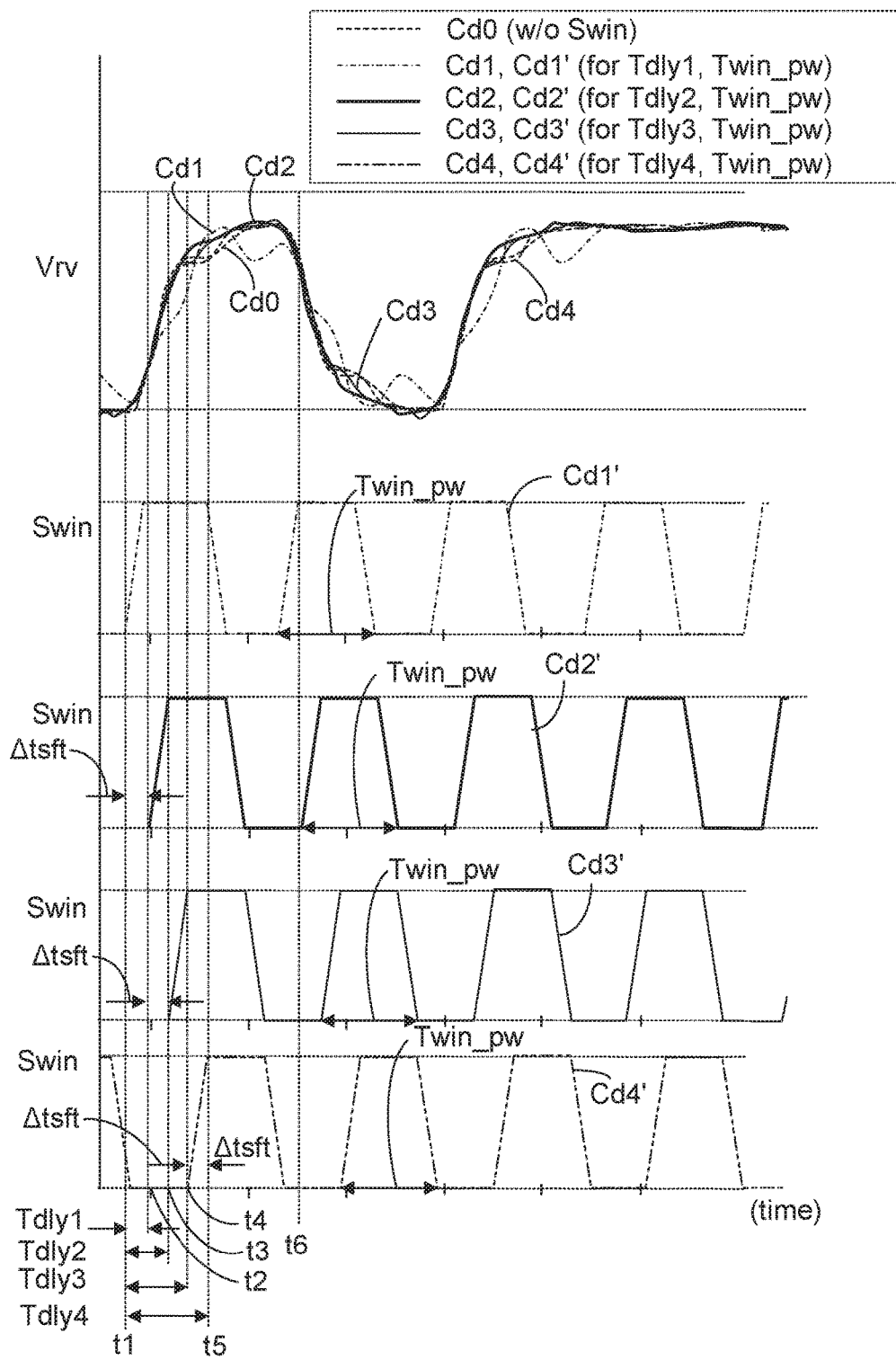
FIG. 15 is a waveform diagram illustrating quality of the channel transmission signal is related to the delay duration Tdly of the window signal Swin.

The window width Twin_pw is longer than or equivalent to the transition interval Ttrs. Furthermore, in a case that the window width Twin_pw is longer than the transition interval Ttrs, the window width Twin_pw may be equivalent to the unit interval. According to the second embodiment, the window delay duration Tdly of the window signal Swin can be adjusted. FIG. 15 is a waveform diagram illustrating quality of the channel transmission signal is related to the window delay duration Tdly of the window signal Swin. For the sake of illustration, the sample delay duration Tsam_dly is not specified in FIG. 15.

The curves shown in upper portion (Cd0, Cd1, Cd2, Cd3, Cd4) and lower portion (Cd1', Cd2', Cd3', Cd4') of FIG. 15 respectively represent how the channel transmission signal and the window signal Swin are changed with different settings of window delay duration Tdly. For comparison purpose, the window width Twin_pw is not changed in FIG. 15. Furthermore, a shift duration Δtsft is used to represent differences between the window delay durations Tdly of window signals Swin.

Curve Cd0 represents the case that no window signal Swin is generated, which implies that the first switching signal Ssw1 and the second switching signal Ssw2 are not generated.

Curves Cd1 and Cd1' represent the case that the window signal Swin having a window delay duration Tdly and a window width Twin_pw is generated. The duration between time point t1 and time point t2 is corresponding to the window delay duration Tdly1.

Curves Cd2 and Cd2' represent the case that the window signal Swin having a window delay duration Tdly2 and the window width Twin_pw is generated. The duration between time point t1 and time point t3 is corresponding to the window delay duration Tdly2.

Curves Cd3 and Cd3' represent the case that the window signal Swin having a window delay duration Tdly3 and the window width Twin_pw is generated. The duration between time point t1 and time point t4 is corresponding to the window delay duration Tdly3.

Curves Cd4 and Cd4' represent the case that the window signal Swin having a window delay duration Tdly4 and the window width Twin_pw is generated. The duration between time point t1 and time point t5 is corresponding to the window delay duration Tdly4.

Between time point t4 and time point t6, the channel transmission signal is in the stable interval Tstbl, and amplitude of curves Cd1, Cd2, Cd3 are greater than that of curve Cd1. This implies that the crosstalk caused by velocity mismatch can be improved when the control module 453 utilizes the window signal Swin to generate the switching signals Ssw1, Ssw2. Among the curves in upper portion of FIG. 15, curve Cd2 is corresponding to the best performance, and this implies setting of the window signal Swin corresponding to curve Cd2' is more appropriate than others.

Because curve Cd4' rises at time point t4, which is relatively late. In consequence, the stable interval Tstbl of the channel transmission signal is slightly affected and amplitude of curve Cd4 is lower than amplitudes of curves Cd1, Cd2, Cd3 between time point t2 and time point t4. Therefore, the control module 453 can further provide the function to calibrate the window delay duration Tdly.

Figure 16:
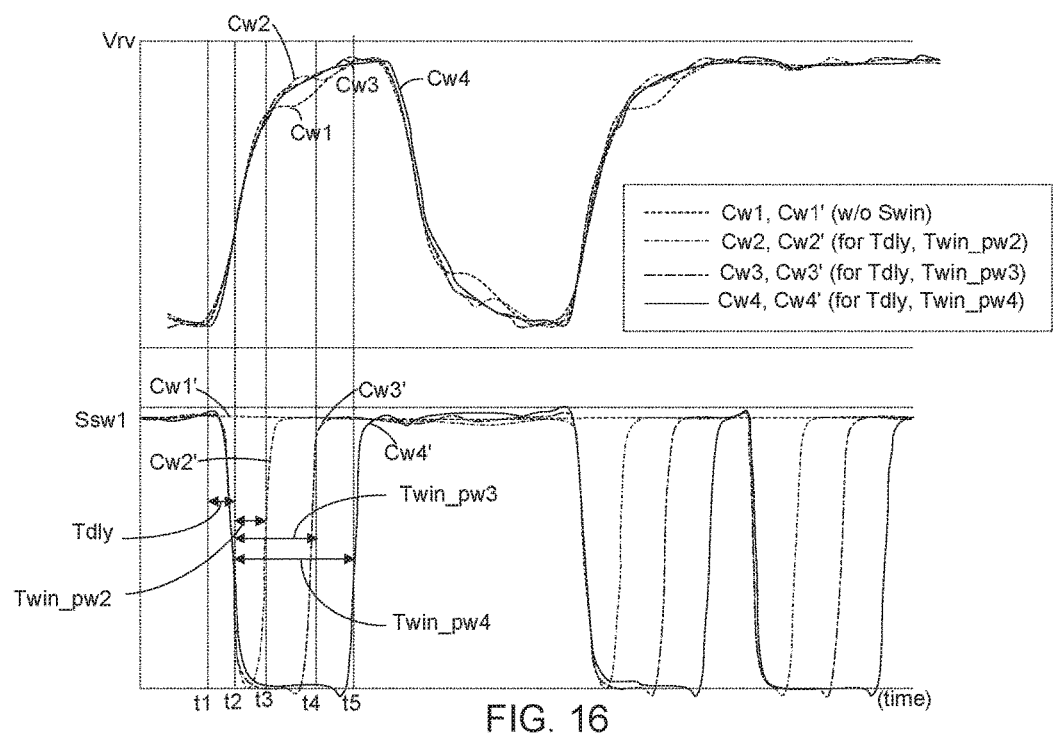
FIG. 16 is a waveform diagram illustrating quality of the channel transmission signal is related to the window width Twin_pw of the window signal Swin.

According to the second embodiment, the window width Twin_pw of the window signal Swin can be adjusted. FIG. 16 is a waveform diagram illustrating quality of the channel transmission signal is related to the window width Twin_pw of the window signal Swin. For the sake of illustration, the sample delay duration Tsam_dly is not specified in FIG. 16.

The curves shown in upper portion of FIG. 16 (Cw1, Cw2, Cw3, Cw4) represent how the receiving voltage Vrv is changed with different settings of the window width Twin_pw. The curves shown in lower portion of FIG. 16 (Cw1', Cw2', Cw3', Cw4') represent the first switching signal Ssw1 is changed with the window signals Swin having different window widths Twin_pw2, Twin_pw3, Twin_pw4. As shown in FIG. 16, the window width Twin_pw2 is shorter than the window width Twin_pw3, and the window width Twin_pw3 is shorter than the window width Twin_pw4.

Curves Cw1 and Cw1' represent the case that no window signal Swin is generated. Meanwhile, the first switching signal Ssw1 is set to the high voltage level.

The duration between time point t1 and time point t2 is the window delay duration Tdly of the window signals Swin, and the receiving voltage Vrv is assumed to be sampled or detected at time point t2.

Curves Cw2 and Cw2' represent the case that the window signal Swin having the window delay duration Tdly and the window width Twin_pw2 is generated. The duration between time point t2 and time point t3 is corresponding to the window width Twin_pw2. As shown in lower portion of FIG. 16, curve Cw2' drops at time point t2 and rises at time point t3.

Curves Cw3 and Cw3' represent the case that the window signal Swin having the window delay duration Tdly and the window widthTwin_pw3 is generated. The duration between time point t2 and time point t4 is corresponding to the window width Twin_pw3. As shown in lower portion of FIG. 16, curve Cw3' drops at time point t2 and rises at time point t4.

Curves Cw4 and Cw4' represent the case that the window signal Swin having the window delay duration Tdly and window width Twin_pw4 is generated. The duration between time point t2 and time point t5 is corresponding to the window width Twin_pw4. As shown in lower portion of FIG. 16, curve Cw4' drops at time point t2 and rises at time point t5.

Between time point t3 and time point t4, the amplitude of the receiving voltage Vrv shown by curve Cw1 is lower than those shown by curves Cw2, Cw3, Cw4. This implies that the speed that the receiving voltage Vrv changes to the voltage level corresponding to the logic of the n-th data bit becomes faster. Therefore, velocity mismatch of the victim channel can be improved when the control module 453 utilizes the window signal Swin to generate the switching signals Ssw1, Ssw2.

Figure 17:
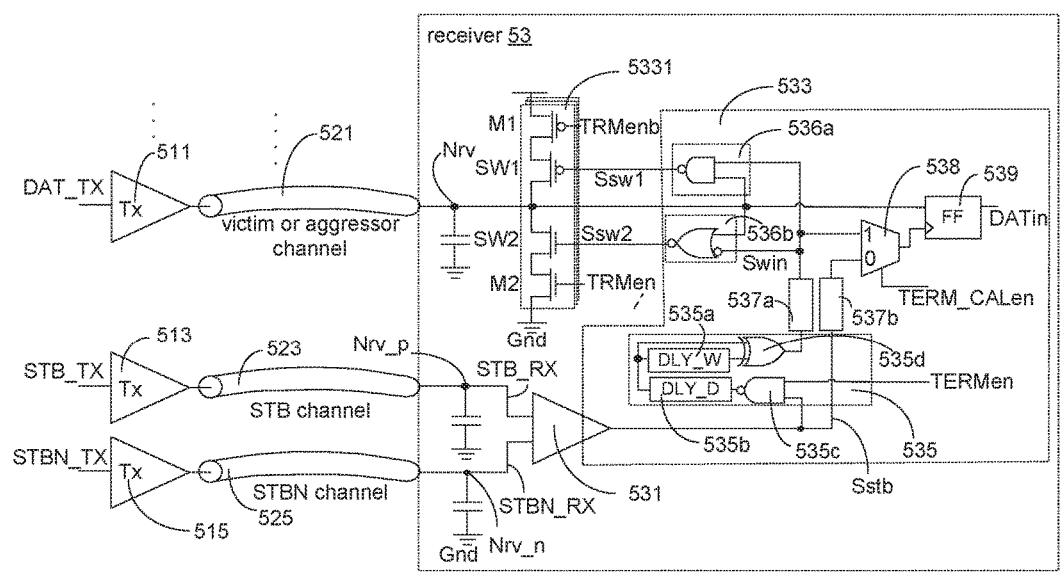
FIG. 17 is a block diagram illustrating an implementation of the receiver according to the second embodiment of the present disclosure.

FIG. 17 is a block diagram illustrating an implementation of the receiver according to the second embodiment of the present disclosure. The receiver includes plurality of termination circuits, which are respectively coupled to the plurality of channels. As illustrated above, each termination circuit 5331 includes an upper circuit 2331a and a lower circuit 2331b. The present disclosure provides an on-die termination (hereinafter, ODT) based design that dynamically conducts the receiving terminal Nrv to the first termination component $Z_P$ (for example, a PMOS transistor M1) or the second termination component $Z_N$ (for example, an NMOS transistor M2). The gate terminal of the PMOS transistor M1 is controlled by a termination enable signal TRMenb, and the gate terminal of the NMOS transistor M2 is controlled by another termination enable signal TRMen.

At the transmitter side, a plurality of original data signals DAT_TX and a pair of differential strobe signals STB_TX, STBN_TX are transmitted by transmitting circuits 511, 513, 515. The original data signals DAT_TX are then passed through the victim and aggressor channels 521 to the termination circuits 5331.

The receiver 53 includes a control module 533, termination circuits 5331, parasitic capacitors Cload and an amplifier 531. The differential strobe signals STB_RX, STBN_RX are received at differential receiving terminals Nrv_p, Nry_n. The amplifier 531 generates the strobe signal Sstb according to the differential strobe signals STB_RX, STBN_RX.

The strobe signal Sstb is received by a window generator 535. The window generator 535 includes an XOR logic gate 535d, a NAND logic gate 535c, a width setting circuit 535a, and a delay setting circuit 535b. The NAND logic gate 535c is coupled to the delay setting circuit 535b. The NAND logic gate 535c receives the strobe signal Sstb and the termination enable signals TRMen, TRMenb. The XOR logic gate 535d receives its input signals from the width setting circuit 535a and the delay setting circuit 535b. A clock tree circuit 537a receives the output of the XOR logic gate 535d and generates the window signal Swin. The window signal Swin is then transmitted to the upper control circuit 536a and the lower control circuit 536b.

Another clock tree circuit 537b is electrically to a multiplexer 538. The multiplexer 538 generates its output based on a calibration enablement signal TERM_CALen. The multiplexer 538 transmits its output to a flip flop 539, and the flip flop 539 outputs the input data signal DAT.

In addition to the window width setting and the window delay duration setting, a resistance value provided by the termination components may vary. In FIG. 17, the receiver 53 includes many termination circuits 5331. When the data bits carried in different signal channels are in common, the control module 533 generates the first switching signals Ssw1 and/or the second switching signals Ssw2 to the termination circuits 5331 which are connected in parallel. Accordingly, the resistance value provided by the receiver is changed with the number of the first/second termination components M1, M2 whose corresponding switches are turned on.

In FIG. 17, the upper control circuit 536a for generating the first switching signal Ssw1 is a NAND logic gate, and the lower control circuit 536b for generating the second switching signal Ssw2 is a NOR logic gate. The NAND logic gate receives the window signal Swin and the receiving voltage Vrv and generates the first switching signal Ssw1, and the NOR logic gate receives the compensated window signal Swin' and the receiving voltage Vrv and generates the second switching signal Ssw2.

To suppress the crosstalk, the present disclosure focuses on the far end design and provides different embodiments of the termination circuit, the receiver and the terminating method. The termination circuit, the receiver and the terminating method can suppress the far end jitter and the far end reflection induced crosstalk without generating continuous dc current. Furthermore, the slew rate can be increased because the reflection induced crosstalk is suppressed.

Different embodiments of the present disclosure are illustrated above. These embodiments show that the present disclosure involves the far end design only, which means that the design of the transmitter can remain unchanged.

With such control mechanism, the receiving voltages Vrv corresponding to different signal channels are simultaneously controlled by their corresponding termination circuits so that the velocity mismatch caused by the even mode and odd mode crosstalk can be reduced. Moreover, since the control mechanism is dynamically applied to the receiving terminal Nrv, dc current is not constantly generated. Consequentially, the swing range of the input data can be increased, power consumption is reduced, and the signal to noise ratio (hereinafter, SNR) of the receiver is increased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A termination circuit coupled to a control module and a receiving terminal for receiving a channel transmission signal, wherein the termination circuit comprises:

an upper circuit, comprising:
  a first termination component, coupled to a first voltage terminal; and
  a first switch, coupled to the first termination component and the receiving terminal, for selectively conducting the receiving terminal to the first termination component according to a first switching signal; and
a lower circuit, comprising:
  a second termination component, coupled to a second voltage terminal; and
  a second switch, coupled to the second termination component and the receiving terminal, for selectively conducting the receiving terminal to the second termination component according to a second switching signal,
wherein the control module detects a voltage level of the receiving terminal in response to a trigger signal, and accordingly controls the first and the second switching signals for a termination duration, wherein the termination duration is corresponding to an n-th data bit carried by the channel transmission signal.

2. The termination circuit according to claim 1, wherein the control module detects the voltage level of the receiving terminal during a stable interval corresponding to an (n−1)-th data bit and accordingly determines voltage levels of the first and the second switching signals for the termination duration, wherein the voltage level of the receiving terminal during the stable interval corresponding to the (n−1)-th data bit represents logic of the (n−1)-th data bit, and the (n−1)-th data bit is prior to the n-th data bit.

3. The termination circuit according to claim 2, wherein the termination duration starts after the trigger signal significantly transits, wherein
  the termination circuit is in a first setting mode during the termination duration when the control module turns on the first switch with the first switching signal; and
  the termination circuit is in a second setting mode during the termination duration when the control module turns on the second switch with the second switching signal.

4. The termination circuit according to claim 3, wherein
  when the termination circuit is in the second setting mode, the control module sets the first switching signal to a first voltage level or a high impedance state and the control module sets the second switching signal to the first voltage level; and
  when the termination circuit is in the first setting mode, the control module sets the first switching signal to a second voltage level and the control module sets the second switching signal to the second voltage level or the high impedance state.

5. The termination circuit according to claim 3, wherein
  the termination circuit is in the first setting mode during the termination duration if the (n−1)-th data bit is logic low; or
  the termination circuit is in the second setting mode during the termination duration if the (n−1)-th data bit is logic high.

6. The termination circuit according to claim 3, wherein a transition interval between the (n−1)-th data bit and the n-th data bit carried by the channel transmission signal is defined as an (n−1)-th transition interval, and the control module detects the voltage level of the receiving terminal during the (n−1)-th transition interval.

7. The termination circuit according to claim 6, wherein the control module determines the termination circuit to be in one of the first setting mode and the second setting mode during the termination duration based on comparison between the detected voltage level of the receiving terminal and at least one threshold voltage.

8. The termination circuit according to claim 7, wherein the at least one threshold voltage comprises a first threshold voltage and a second threshold voltage, and the first threshold voltage is greater than the second threshold voltage.

9. The termination circuit according to claim 8, wherein the control module compares the detected voltage level of the receiving terminal with the first threshold voltage if the (n−1)-th data bit is logic high, wherein
  the termination circuit is in the first setting mode during the termination duration if the detected voltage level of the receiving terminal is greater than the first threshold voltage; and
  the termination circuit is in the second setting mode during the termination duration if the detected voltage level of the receiving terminal is lower than or equivalent to the first threshold voltage.

10. The termination circuit according to claim 8, wherein the control module compares the detected voltage level of the receiving terminal with the second threshold voltage if the (n−1)-th data bit is logic low, wherein
  the termination circuit is in the second setting mode during the termination duration if the detected voltage level of the receiving terminal is lower than the second threshold voltage; and
  the termination circuit is in the first setting mode during the termination duration if the detected voltage level of the receiving terminal is greater than or equivalent to the second threshold voltage.

11. The termination circuit according to claim 1, wherein the first termination component is a PMOS transistor and the second termination component is an NMOS transistor.

12. A receiver, for receiving at least one channel transmission signal through at least one receiving terminal, wherein the receiver comprises:
  at least one termination circuit, coupled to at least one signal channel through the at least one receiving terminal, wherein a first termination circuit of the at least one termination circuit is coupled to a first receiving terminal of the at least one receiving terminal, and the first termination circuit comprises:
    an upper circuit, comprising:
      a first termination component, coupled to a first voltage terminal; and
      a first switch, coupled to the first termination component and the first receiving terminal, for selectively conducting the first receiving terminal to the first termination component according to a first switching signal; and
    a lower circuit, comprising:
      a second termination component, coupled to a second voltage terminal; and
      a second switch, coupled to the second termination component and the first receiving terminal, for selectively conducting the first receiving terminal to the second termination component according to a second switching signal; and
    a control module, coupled to the at least one termination circuit, wherein the control module detects a voltage level of the first receiving terminal in response to a trigger signal, and accordingly controls the first and the second switching signals for a termination duration, wherein the termination duration is corresponding to an n-th data bit carried by the channel transmission signal.

13. The receiver according to claim 12, wherein the control module detects the voltage level of the receiving terminal during a stable interval corresponding to an (n−1)- th data bit and determines voltage levels of the first and the second switching signals for the termination duration, wherein the voltage level of the receiving terminal during the stable interval corresponding to the (n−1)-th data bit represents logic of the (n−1)-th data bit, and the (n−1)-th data bit is prior to the n-th data bit.

14. The receiver according to claim 13, wherein the termination duration starts after the trigger signal significantly transits, wherein
the first termination circuit operates in a first setting mode during the termination duration when the control module turns on the first switch with the first switching signal; and
the first termination circuit operates in a second setting mode during the termination duration when the control module turns on the second switch with the second switching signal.

15. The receiver according to claim 14, wherein
the first termination circuit is in the first setting mode during the termination duration if the (n−1)-th data bit is logic low; or
the first termination circuit is in the second setting mode during the termination duration if the (n−1)-th data bit is logic high.

16. The receiver according to claim 14, wherein a transition interval between the (n−1)-th data bit and the n-th data bit of the channel transmission signal is defined as an (n−1)-th transition interval, and the control module detects the voltage level of the first receiving terminal during the (n−1)-th transition interval.

17. The receiver according to claim 16, wherein the control module determines the termination circuit to be in one of the first setting mode and the second setting mode based on comparison between the detected voltage level of the first receiving terminal and a first threshold voltage and a second threshold voltage, wherein the first threshold voltage is greater than the second threshold voltage.

18. The receiver according to claim 17, wherein the control module compares the detected voltage level of the first receiving terminal with the first threshold voltage if the (n−1)-th data bit is logic high, wherein
the first termination circuit is in the first setting mode during the termination duration if the detected voltage level of the first receiving terminal is greater than the first threshold voltage; and
the first termination circuit is in the second setting mode during the termination duration if the detected voltage level of the first receiving terminal is lower than or equivalent to the first threshold voltage.

19. The receiver according to claim 17, wherein the control module compares the detected voltage level with the second threshold voltage if the (n−1)-th data bit is logic low, wherein
the first termination circuit is in the second setting mode during the termination duration if the detected voltage level of the first receiving terminal is lower than the second threshold voltage; and
the first termination circuit is in the first setting mode during the termination duration if the detected voltage level of the first receiving terminal is greater than or equivalent to the second threshold voltage.

20. A terminating method applied to a receiver comprising a control module and a termination circuit, wherein the termination circuit is coupled to a receiving terminal and the control module and the terminating method comprises steps of:
detecting a voltage level of the receiving terminal by the control module in response to a trigger signal;
controlling a first switching signal and a second switching signal by the control module for a termination duration, wherein the termination duration is corresponding to an n-th data bit carried by the channel transmission signal; and
selectively conducting the receiving terminal to one of a first voltage terminal and a second voltage terminal by the termination circuit according to the first switching signal and the second switching signal.

* * * * *